US008225502B2

(12) United States Patent
Kaneko

(10) Patent No.: US 8,225,502 B2
(45) Date of Patent: Jul. 24, 2012

(54) WIRING BOARD MANUFACTURING METHOD

(75) Inventor: Kentaro Kaneko, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 1086 days.

(21) Appl. No.: 12/102,303

(22) Filed: Apr. 14, 2008

(65) Prior Publication Data

US 2008/0257596 A1 Oct. 23, 2008

(30) Foreign Application Priority Data

Apr. 17, 2007 (JP) ................................. 2007-108152

(51) Int. Cl.
*H01K 3/10* (2006.01)

(52) U.S. Cl. ............... 29/852; 29/846; 29/830; 174/262

(58) Field of Classification Search .......... 174/260–262; 204/192.32; 29/830–832, 840, 846, 852
See application file for complete search history.

(56) References Cited

U.S. PATENT DOCUMENTS

| 4,766,084 A * | 8/1988 | Bory et al. ................ 204/192.32 |
| 6,294,743 B1 * | 9/2001 | Kinoshita ..................... 174/261 |
| 7,093,356 B2 * | 8/2006 | Imafuji et al. .................. 29/852 |

FOREIGN PATENT DOCUMENTS

| JP | 9293956 | 11/1997 |
| JP | 2000-323613 | 11/2000 |
| JP | 2004-79756 A | 3/2004 |
| JP | 2005-327780 A | 11/2005 |
| JP | 2006186321 | 7/2006 |
| JP | 2007-013092 | 1/2007 |
| JP | 2007-73991 A | 3/2007 |
| WO | 03/007370 | 1/2003 |
| WO | 03039219 | 5/2003 |

* cited by examiner

*Primary Examiner* — Donghai D. Nguyen
(74) *Attorney, Agent, or Firm* — Rankin, Hill & Clark LLP

(57) ABSTRACT

A semiconductor device 100 has such a structure that a semiconductor chip 110 is flip-chip mounted on a wiring board 120. The wiring board 120 has a multilayer structure in which a plurality of wiring layers and a plurality of insulating layers are arranged, and a first electrode pad 130 is formed on a chip mounting side. A taper surface 132 of the first electrode pad 130 has a gradient in an orientation reduced in an upward direction toward a solder connecting side or a chip mounting side. Therefore, a holding force for a force applied to the solder connecting side or the chip mounting side is increased, and furthermore, the taper surface 132 adheres to a tapered internal wall of an insulating layer of a first layer so that a bonding strength to the insulating layer is increased.

15 Claims, 35 Drawing Sheets

WIRING BOARD MANUFACTURING METHOD

BACKGROUND OF THE INVENTION

The present invention relates to a method of manufacturing a wiring board, a method of manufacturing a semiconductor device, and the wiring board, and more particularly to a method of manufacturing a wiring board which is constituted to enhance a reliability in an electrode pad forming portion of a multilayer substrate, a method of manufacturing a semiconductor device, and the wiring board.

For example, as one of methods of forming a ball in BGA (Ball Grid Array) to be used for connecting a bare chip to a substrate or connecting a package substrate to a mother board, there has been known a manufacturing method of forming a plurality of electrodes on a substrate, then forming a solder resist having holes communicating with the electrodes, fusing, through a heat treatment (a reflow), a solder ball put on an opening of each of the holes and bonding the solder ball thus fused to the electrode in the hole, and forming a solder bump in a protruding state on a surface of the solder resist.

On the other hand, a package having a bare chip mounted on a multilayer substrate has also been developed with a reduction in a size and an increase in an integration in a bare chip (for example, see Patent Document 1).

FIG. 1 shows an example of a structure of a conventional wiring board. In the structure of the board shown in FIG. 1, layers are arranged in such a manner that an outer periphery of an electrode pad 10 is covered with a first insulating layer 12 and an upper surface of the electrode pad 10 is covered with a second insulating layer 13, and a via 14 extended upward from a center of the upper surface of the electrode pad 10 penetrates through the second insulating layer 13 and is thus connected to a wiring layer 16 in an upper part.

The electrode pad 10 has a structure in which an Au layer 17 and an Ni layer 18 are arranged and is provided in such a manner that a surface of the Au layer 17 is exposed from the first insulating layer 12 and the via 14 is connected to the Ni layer 18.

Furthermore, a semiconductor chip is mounted on the electrode pad 10 through a solder bump in some cases, and a solder ball or a pin is bonded to the electrode pad 10 in the other cases. In a wiring board having a multilayer structure, thus, the electrode pad 10 is used as a bare chip loading pad or an external connecting pad.

[Patent Document 1]
Japanese Patent No. 3635219 (JP-A-2000-323613)

In the wiring board shown in FIG. 1, however, the outer periphery of the electrode pad 10 is comparatively smooth. Therefore, an adhesion to the first insulating layer 12 is small. When heating is carried out through a reflow treatment, there is a possibility that a thermal stress might be applied based on a difference in a thermal expansion between the first insulating layer 12 and the electrode pad 10, resulting in the generation of a delamination in a boundary portion provided in contact with the outer periphery of the electrode pad 10 and a breakage of a part of the first insulating layer 12.

In the case in which a part of the first insulating layer 12 provided in contact with an outer periphery of a corner portion (B portion) of the electrode pad 10 is broken off due to heating through the reflow treatment, furthermore, there is a problem in that a crack 20 might be generated from a corner portion (A portion) of the electrode pad 10 toward the second insulating layer 13.

When there is applied a force for separating a semiconductor chip from the wiring board in a state in which the delamination or the crack is generated after the semiconductor chip is mounted on the electrode pad 10 through the solder bump, moreover, the electrode pad 10 might be separated from the first insulating layer 12.

In consideration of the circumstances, therefore, it is an object of the invention to provide a method of manufacturing a wiring board, a method of manufacturing a semiconductor device, and the wiring board which solve the problems.

In order to solve the problems, the invention has the following means.

According to a first aspect of the invention, there is provided a method of manufacturing a wiring board including:
a first step of forming a resist layer on a support substrate;
a second step of forming, on the resist layer, a tapered opening having a small diameter at the support substrate side and a large diameter at an opening side;
a third step of forming, on an inner part of the tapered opening, an electrode pad having a large diameter at the opening side;
a fourth step of removing the resist layer and forming an insulating layer around the electrode pad and on the support substrate;
a fifth step of forming a via which exposes the electrode pad to the insulating layer;
a sixth step of forming a wiring layer to be electrically connected to the electrode pad on surfaces of the via and the insulating layer; and
a seventh step of removing the support substrate and exposing an end face at a small diameter side of the electrode pad.

According to a second aspect of the invention, there is provided a method of manufacturing a wiring board including:
a first step of forming an insulating layer on a support substrate;
a second step of forming, on the insulating layer, a tapered opening having a small diameter at the support substrate side and a large diameter at an opening side;
a third step of forming, on an inner part of the tapered opening, an electrode pad having a large diameter at the opening side;
a fourth step of forming, on a surface of the insulating layer, a wiring layer to be electrically connected to the electrode pad; and
a fifth step of removing the support substrate and exposing an end face at a small diameter side of the electrode pad.

According to a third aspect of the invention, there is provided the method of manufacturing a wiring board according to the first or second aspect, wherein
the electrode pad has a tilt angle $\theta$ to a horizontal plane of a tapered outer peripheral surface which is set to be 50 to 80 degrees.

According to a forth aspect of the invention, there is provided the method of manufacturing a wiring board according to the first aspect, wherein
the fourth step includes a step of roughening a surface including a tapered outer peripheral surface of the electrode pad before forming the insulating layer.

According to a fifth aspect of the invention, there is provided the method of manufacturing a wiring board according to the second aspect, wherein
the third step includes a step of roughening an inner part of the tapered opening before forming the electrode pad.

According to a sixth aspect of the invention, there is provided the method of manufacturing a wiring board according to the first aspect, wherein
the support substrate is formed of a metal;
the third step includes a step of forming a metal layer of the same type as the support substrate between the support substrate and the electrode pad; and the seventh step includes a step of removing the support substrate and removing the metal layer to cause an exposed surface of the electrode pad to form a tapered opening.

According to a seventh aspect of the invention, there is provided the method of manufacturing a wiring board according to the second aspect, wherein the support substrate is formed of a metal;

the third step includes a step of forming a metal layer of the same type as the support substrate between the support substrate and the electrode pad; and the fifth step includes a step of removing the support substrate and removing the metal layer to cause an exposed surface of the electrode pad to form a tapered opening.

According to an eighth aspect of the invention, there is provided a method of manufacturing a semiconductor device using the method of manufacturing a wiring board according to any of the first to seventh aspects, further including:

a step of mounting a semiconductor chip on the electrode pad through a solder bump.

According to a ninth aspect of the invention, there is provided a method of manufacturing a semiconductor device using the method of manufacturing a wiring board according to any of the first to seventh aspects, further including:

a step of mounting a semiconductor chip on a surface at an opposite side to an electrode pad forming surface on which the electrode pad of the wiring board is formed.

According to a tenth aspect of the invention, there is provided a wiring board including:

an electrode pad; and an insulating layer formed in contact with the electrode pad, wherein the electrode pad is formed to take a taper shape having a large diameter at an insulating layer side on which the insulating layer is formed and a small diameter at an exposed surface side of the electrode pad.

According to the invention, the outer periphery of the electrode pad is formed to be tapered in such a manner that the support substrate side or the solder connecting side has a small diameter. Therefore, an adhesion of the outer periphery of the electrode pad to the insulating layer can be enhanced, and a delamination is generated with difficulty in a boundary portion of the insulating layer even if a thermal stress generated by a reflow acts, for example. In addition, it is possible to prevent a crack from being generated on the insulating layer from a corner portion of the outer periphery of the electrode pad. Furthermore, the outer periphery of the electrode pad is formed with a gradient having an orientation reduced in a direction of the exposed surface of the taper portion. Therefore, the tapered outer periphery of the electrode pad adheres to the tapered internal wall of the insulating layer so that a bonding strength of the electrode pad can be increased.

BRIEF DESCRIPTION OF THE DRAWINGS

FIG. 3O is a view for explaining a method (No. 15) of manufacturing the wiring board according to the first example.

DETAILED DESCRIPTION OF THE PREFERRED EMBODIMENTS

The best mode for carrying out the invention will be described below with reference to the drawings.

FIRST EXAMPLE

Figure 2:
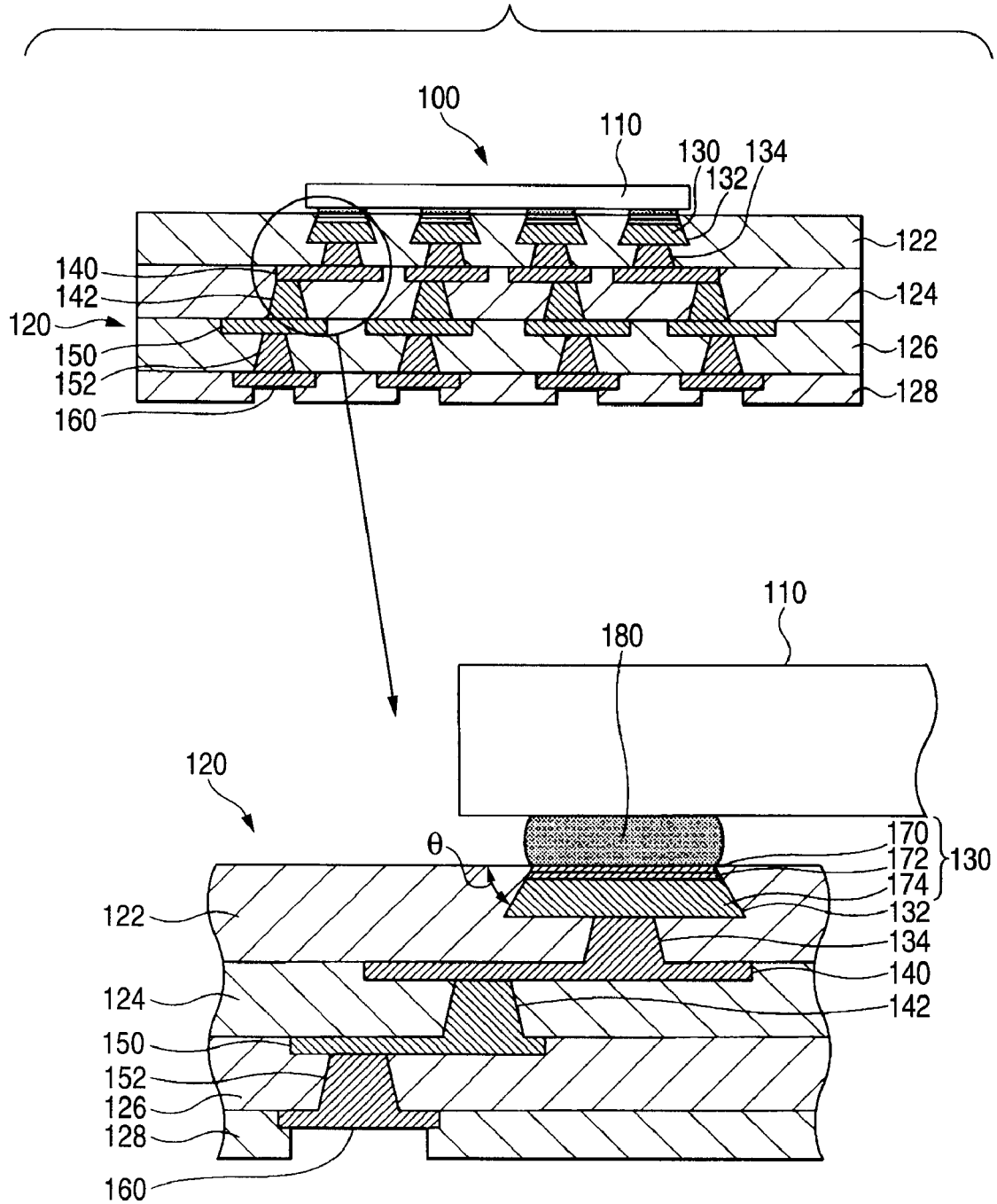
FIG. 2 is a longitudinal sectional view showing a semiconductor device to which a first example of a wiring board according to the invention is applied.

FIG. 2 is a longitudinal sectional view showing a semiconductor device to which a first example of a wiring board according to the invention is applied. As shown in FIG. 2, a semiconductor device 100 has such a structure that a semiconductor chip 110 is flip-chip mounted on a wiring board 120, for example. The wiring board 120 has a multilayer structure in which a plurality of wiring layers and a plurality of insulating layers are arranged, and has a structure in which respective insulating layers of a first layer 122, a second layer 124, a third layer 126 and a fourth layer 128 which have wiring layers are arranged in a vertical direction according to the example. Each of the insulating layers is formed by an insulating resin such as an epoxy resin or a polyimide resin.

The insulating layers of the first layer 122 and the fourth layer 128 over which a solder connection is to be carried out may be formed by an insulating resin to be a solder resist (formed by an acryl resin or an epoxy resin). In the semiconductor device 100, moreover, an underfill resin having an insulating property may be filled between the semiconductor chip 110 and the wiring board 120.

The first layer 122 in an uppermost stage is provided with a first electrode pad 130 and a via 134 to which a terminal of the semiconductor chip 110 is to be flip-chip connected. Moreover, the second layer 124 arranged under the first layer 122 is provided with a wiring pattern layer 140 and a via 142 which are conducted to the via 134. Furthermore, the third layer 126 arranged under the second layer 124 has a wiring pattern layer 150 and a via 152 which are conducted to the via 142. In addition, the fourth layer 128 arranged under the third layer 126 has a second electrode pad 160 conducted to the via 152.

The first electrode pad 130 has a three-layer structure in which Au, Ni and Cu layers 170, 172 and 174 having a high bonding property to a solder are arranged. The Au layer 170 is exposed from the upper surface side of the wiring board 120 (a semiconductor chip mounting side), and a solder bump 180 of the semiconductor chip 110 is connected to the Au layer 170. Moreover, Au/Pd/Ni, Sn/Ni, Sn—Ag (an alloy of tin and silver) and Sn can also be used in place of the Au layer 170 and the Ni layer 172. Furthermore, the first electrode pad 130 may be formed of only the metals. In addition, it is a matter of course that each of the metals can be used without a restriction and a combination of the respective metals is not restricted to the combination.

The terminal of the semiconductor chip 110 is soldered to the Au layer 170 through the solder bump 180 and is thus conducted to the first electrode pad 130. The solder bump 180 is formed by putting a solder ball on the first electrode pad 130 and carrying out a reflow (a heat treatment). In the example, the first electrode pad 130 is formed to have a diameter of approximately 70 to 100 μm and a thickness of approximately 15 μm (±10 μm), for instance.

The first electrode pad 130 is formed in such a manner that an outside diameter of an upper surface side (a solder connecting side and a chip mounting side) is small and that of a lower surface side (a laminating side of the substrate) is large. Therefore, an outer peripheral surface forms a taper surface 132. In the example, a gradient is set in such a manner that a gradient angle θ of the taper surface 132 of the first electrode pad 130 (a tilt angle to a horizontal plane) is set to be θ=50 to 80 degrees. The gradient angle θ is not restricted thereto but it is also possible to set the gradient angle θ to be an optional angle which is smaller than 50 degrees or is equal to or greater than 80 degrees.

Moreover, the taper surface 132 of the first electrode pad 130 has a gradient in an orientation which is reduced in an upward direction toward the chip mounting side. A holding force for a force applied to the chip mounting side is increased, and furthermore, the taper surface 132 adheres to a tapered internal wall of the first layer 122 so that a bonding strength to the insulating layer is increased. The adhesion of the taper surface 132 to the tapered internal wall of the first layer 122 is increased so that a thermal stress generated by the reflow treatment acts and a delamination and a crack can be thus prevented from being generated on the insulating layer of the first layer 122 covering the outer periphery of the first electrode pad 130.

In the first electrode pad 130, moreover, a surface area of the taper surface 132 is larger than that of a cylindrical shape having an equal diameter in a vertical direction, and the taper surface 132 is formed in such a manner that an outside diameter of an upper surface side (the semiconductor chip mounting side) is smaller than that of a lower surface side (the substrate laminating side). Therefore, the first electrode pad 130 is held in a state in which a bonding strength to a force for pulling the semiconductor chip 110 upward is increased more greatly.

Figure 3A:
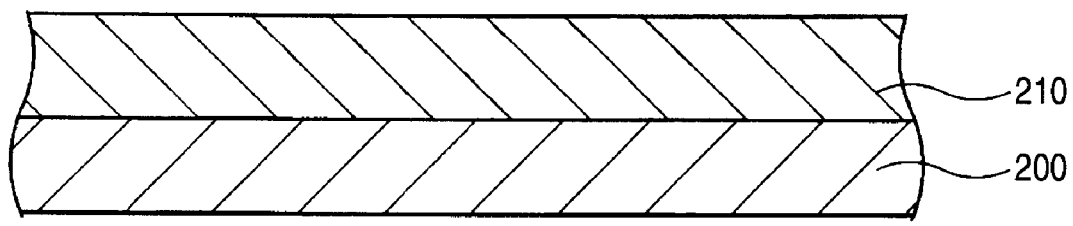
FIG. 3A is a view for explaining a method (No. 1) of manufacturing the wiring board according to the first example.

A method of manufacturing the wiring board 120 to be used in the semiconductor device 100 will be described with reference to FIGS. 3A to 3O. FIGS. 3A to 3O are views for explaining methods (Nos. 1 to 15) of manufacturing the wiring board 120 according to the first example. In FIGS. 3A to 3O, the respective layers are arranged in a facedown direction in which the first electrode pad 130 is provided on a lower surface side of the wiring board 120 (a vertically reverse direction to the lamination structure shown in FIG. 2).

In FIG. 3A, first of all, there is prepared a support substrate 200 formed by a flat Cu plate or a Cu foil which has a predetermined thickness. A resin film such as a dry film resist is laminated as a plating resist on an upper surface of the support substrate 200 to form a resist layer 210. Moreover, it is also possible to apply a liquid resist in place of the dry film resist.

Figure 3B:
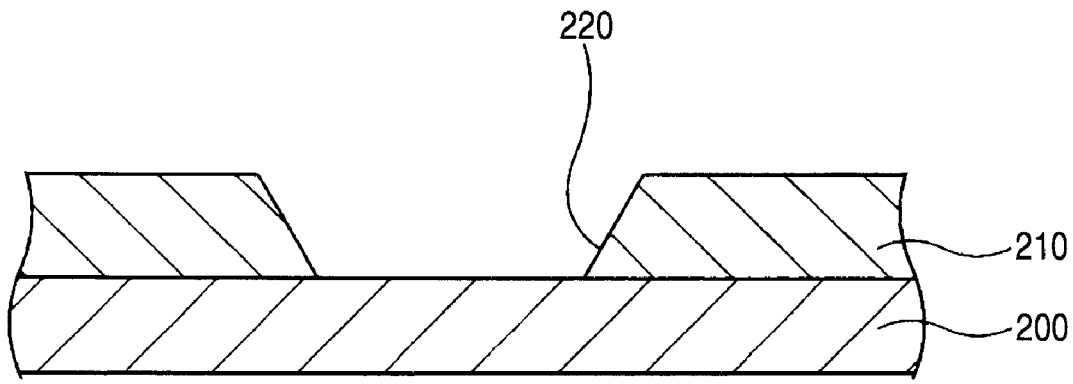
FIG. 3B is a view for explaining a method (No. 2) of manufacturing the wiring board according to the first example.

In FIG. 3B, a tapered opening 220 for forming a first electrode which exposes a part of the support substrate 200 through an exposure is formed on the resist layer 210. An internal wall of the tapered opening 220 for forming a first electrode acts as a tapered internal wall for forming the taper surface 132 of the first electrode pad 130. Accordingly, a gradient of the taper surface 132 of the first electrode pad 130 is determined by a gradient of the tapered opening 220 for forming a first electrode (a tilt angle θ formed with respect to a horizontal plane).

A tilt angle of the taper surface 132 is set to be θ=50 to 80 degrees, and an optional angle which is varied depending on a processing method is set thereto. For example, in a method of carrying out a laser processing over a thermosetting epoxy resin film, the tilt angle of the taper surface 132 can be set to be θ≈80 degrees. In the case in which patterning is carried out over a liquid resist through an exposing technique, moreover, the tilt angle of the taper surface 132 can be set to be θ=50 degrees.

Figure 3C:
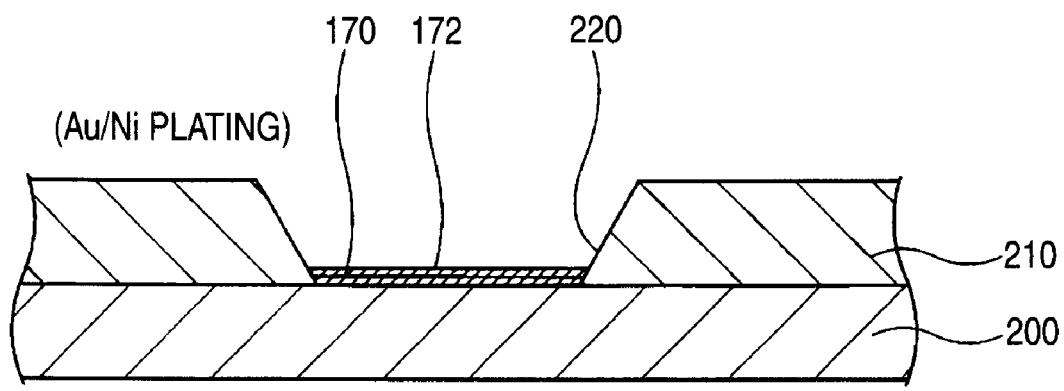
FIG. 3C is a view for explaining a method (No. 3) of manufacturing the wiring board according to the first example.

In FIG. 3C, the support substrate 200 is used as a feeding layer to carry out electrolytic plating so that Au is deposited on the support substrate 200 in the tapered opening 220 for forming a first electrode and the Au layer 170 is thus formed, and furthermore, Ni is deposited on the surface of the Au layer 170 to arrange the Ni layer 172.

Figure 3D:
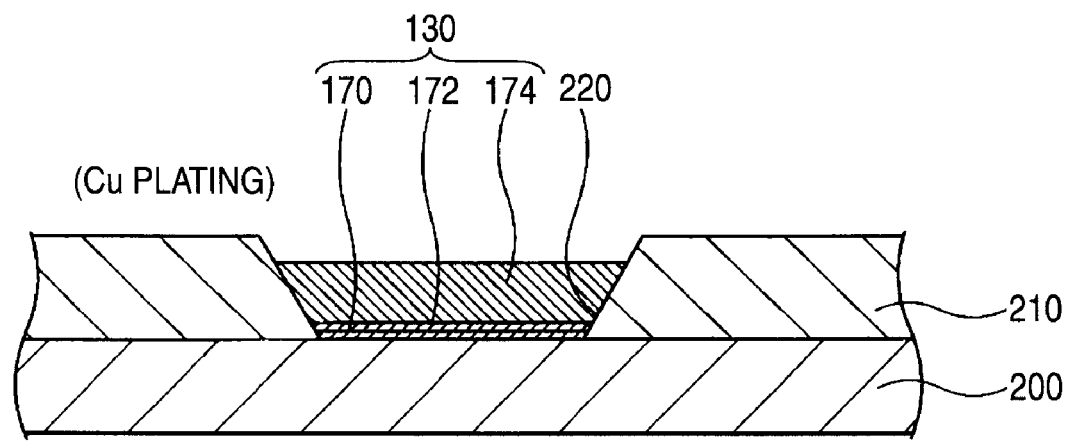
FIG. 3D is a view for explaining a method (No. 4) of manufacturing the wiring board according to the first example.

In FIG. 3D, furthermore, the support substrate 200 is used as the feeding layer to carry out electrolytic Cu plating so that Cu is deposited on the Ni layer 172 in the tapered opening 220 for forming a first electrode and the Cu layer 174 is thus arranged to form the first electrode pad 130. Consequently, the first electrode pad 130 having a three-layer structure including the Au layer 170, the Ni layer 172 and the Cu layer 174 is formed in the opening 220 for forming a first electrode pad.

Figure 3E:
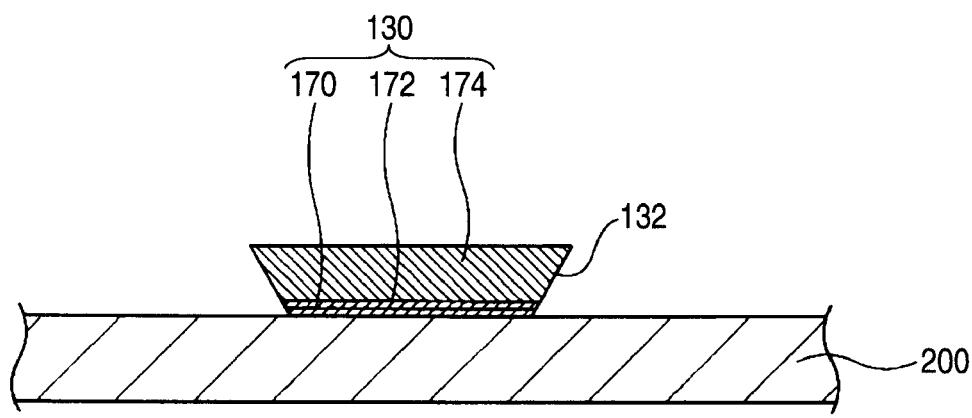
FIG. 3E is a view for explaining a method (No. 5) of manufacturing the wiring board according to the first example.

In FIG. 3E, the resist 210 is removed from the support substrate 200 so that the first electrode pad 130 having the outer periphery tapered is left on the support substrate 200 in a taper laminating state.

Figure 3F:
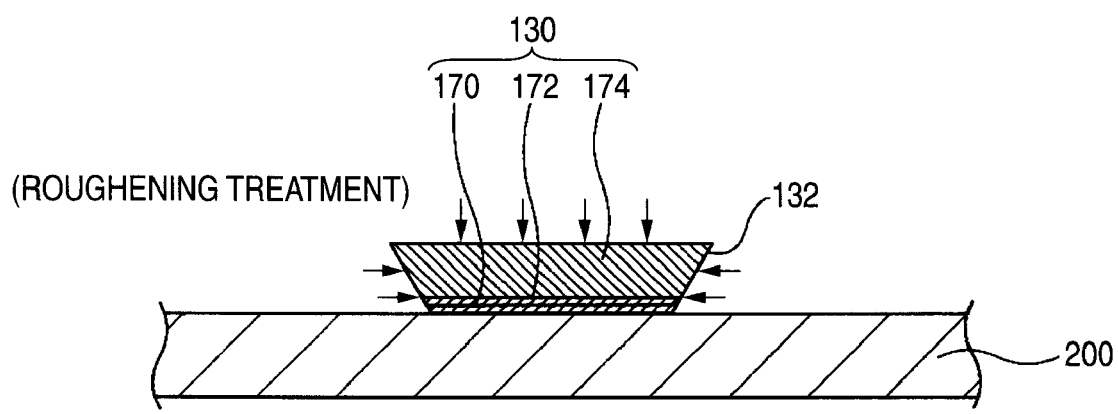
FIG. 3F is a view for explaining a method (No. 6) of manufacturing the wiring board according to the first example.

In FIG. 3F, a roughening treatment is carried out over the surface of the first electrode pad 130 to roughen the surface of the first electrode pad 130. It is preferable that a surface roughness obtained by the roughening treatment should be set to have Ra=approximately 0.25 to 0.75 μm, for example. Moreover, the roughening treatment may be carried out over the surface of the support substrate 200.

Figure 3G:
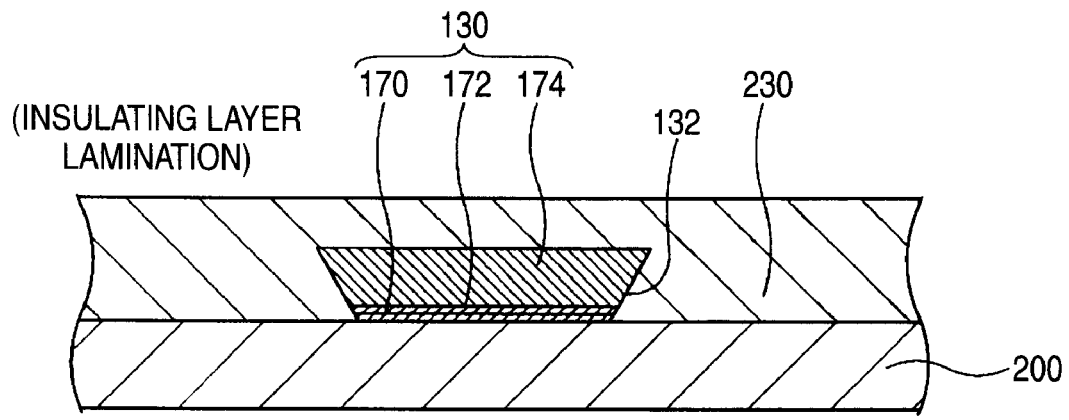
FIG. 3G is a view for explaining a method (No. 7) of manufacturing the wiring board according to the first example.

In FIG. 3G, a resin film 230 such as an epoxy resin or a polyimide resin is laminated on the surfaces of the support substrate 200 and the first electrode pad 130 subjected to the roughening treatment. The resin film 230 serves as the insulating layer of the first layer 122.

The resin film 230 is laminated on the surfaces of the support substrate 200 and the first electrode pad 130 by using a vacuum lamination method or a vacuum type hot press. The resin film 230 is bonded by pressure to the upper surfaces and outer peripheral surfaces of the support substrate 200 and the first electrode pad 130 in a vacuum. Consequently, the resin film 230 is laminated on the taper surface 132 of the first electrode pad 130 in an adhering state without a clearance so that a void can be prevented from being generated. In addition, the surface of the first electrode pad 130 is roughened. Therefore, an adhesion of the resin film 230 to the first electrode pad 130 can be enhanced so that a delamination can be prevented from being generated by a thermal stress.

Figure 3H:
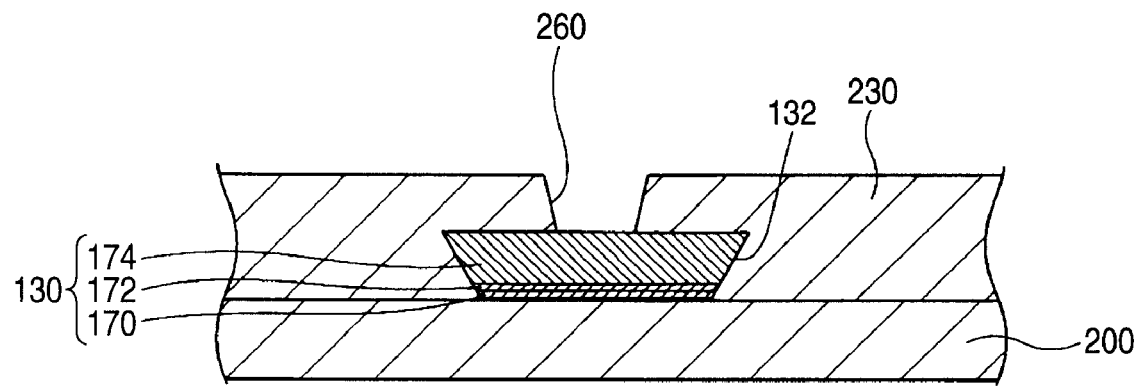
FIG. 3H is a view for explaining a method (No. 8) of manufacturing the wiring board according to the first example.

In FIG. 3H, a surface of the resin film 230 is flattened, and furthermore, a laser beam is irradiated to form a via hole 260 in such a manner that a center of the upper surface of the first electrode pad 130 is exposed, for example.

Figure 3I:
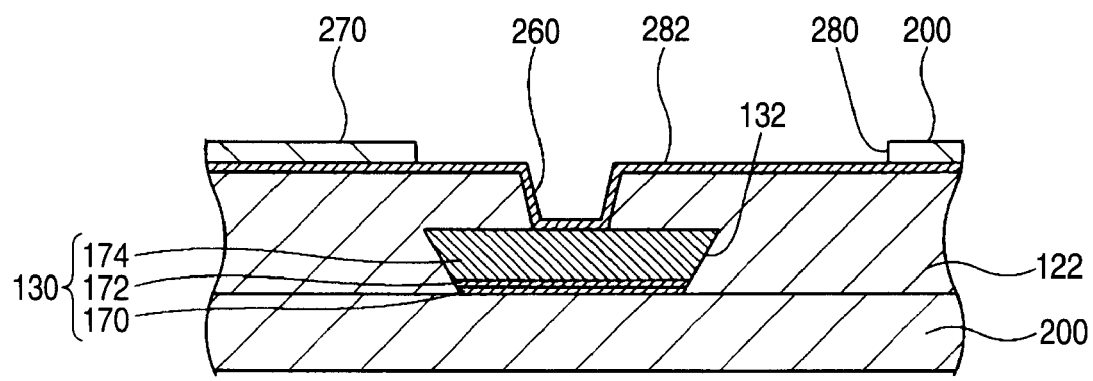
FIG. 3I is a view for explaining a method (No. 9) of manufacturing the wiring board according to the first example.

In FIG. 3I, a seed layer 282 is formed, by noneletrolytic Cu plating, on the surfaces of the insulating layer of the first layer 122 and the first electrode pad 130 exposed to a bottom portion of the via hole 260. For a method of forming the seed layer 282, another thin film forming method (a sputtering method or a CVD method) may be used or a conducive metal other than Cu may be formed. In order to enhance an adhesion, moreover, it is also possible to form the seed layer after carrying out the roughening treatment over the surfaces of the insulating layer of the first layer 122 and the first electrode pad 130.

Subsequently, a dry film resist 270 is laminated on the surface (the upper surface) of the insulating layer of the first layer 122. Then, patterning (exposure and development) is carried out over the dry film resist 270 to form an opening 280 for forming a wiring pattern which exposes a part of the seed layer 282.

Figure 3J:
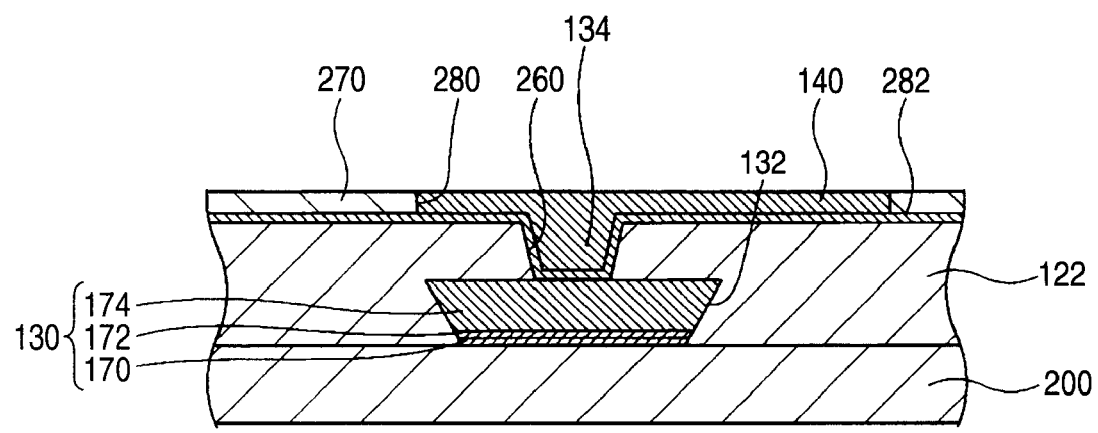
FIG. 3J is a view for explaining a method (No. 10) of manufacturing the wiring board according to the first example.

In FIG. 3J, electrolytic Cu plating is carried out by feeding the seed layer 282 so that Cu is deposited on the seed layer 282 in the via hole 260 and the opening 280 for forming a wiring pattern to form the via 134 and the wiring pattern layer 140.

Figure 3K:
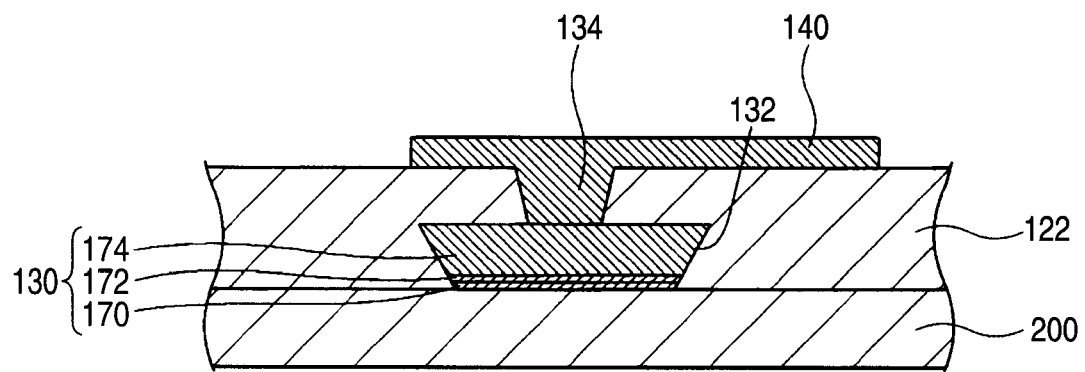
FIG. 3K is a view for explaining a method (No. 11) of manufacturing the wiring board according to the first example.

In FIG. 3K, the dry film resist 270 and the seed layer 282 other than the seed layer 282 provided under the wiring pattern layer 140 are removed from the surface (the upper surface) of the first layer 122. Consequently, the wiring pattern layer 140 is left on the surface (the upper surface) of the insulating layer of the first layer 122. In FIG. 3K and succeeding drawings, the seed layer 282 is not shown.

Figure 3L:
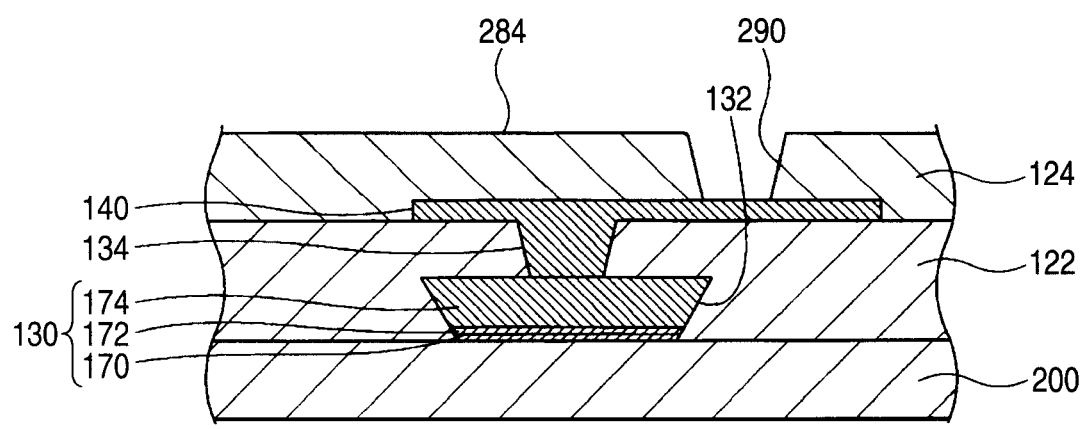
FIG. 3L is a view for explaining a method (No. 12) of manufacturing the wiring board according to the first example.

In FIG. 3L, a roughening treatment is carried out over the surfaces of the insulating layer of the first layer 122 and the wiring pattern layer 140 and a film-shaped so-called built-up resin 284 containing an epoxy resin as a main component (a content of a filler may be properly changed corresponding to a hardness or a flexibility which is required) is then laminated to form the insulating layer of the second layer 124. Thereafter, a laser beam is irradiated to form a via hole 290 in such a manner that the surface of the wiring pattern layer 140 is exposed, for example.

Subsequently, the steps of FIGS. 3H to 3L are repeated to form the via 142 of the second layer 124 and the wiring pattern layer 150 of the third layer 126. In the case in which at least four wiring boards 120 are to be arranged, moreover, it is preferable that the steps of FIGS. 3H to 3L should be correspondingly repeated.

Figure 3M:
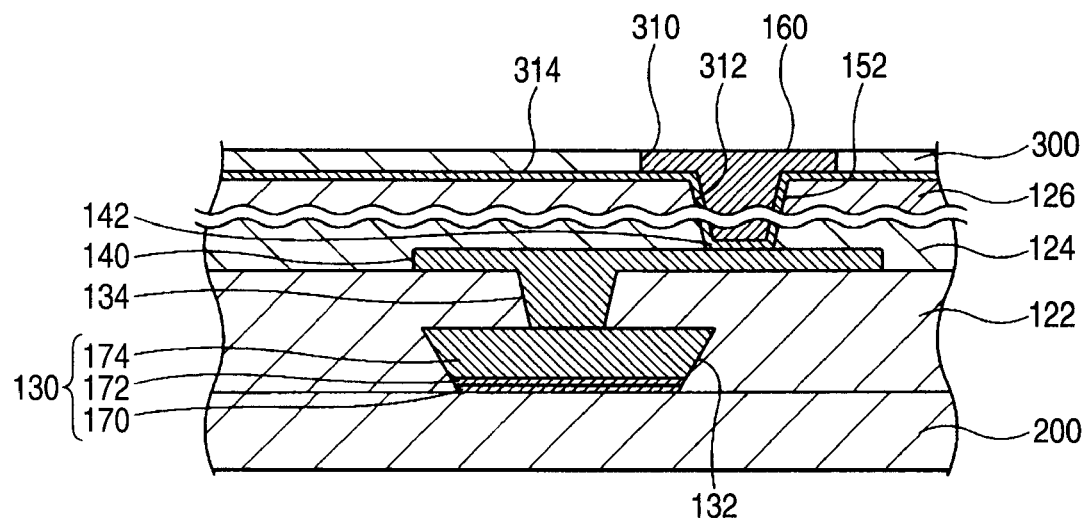
FIG. 3M is a view for explaining a method (No. 13) of manufacturing the wiring board according to the first example.

In FIG. 3M, a seed layer 314 is formed by nonelectrolytic Cu plating over the surface (upper surface) of the insulating layer of the third layer 126, and subsequently, a dry film resist 300 is laminated as a plating resist. For a method of forming the seed layer 314, a thin film forming method other than the nonelectrolytic Cu plating may be used or the seed layer 314 may be formed by a conductive metal other than Cu.

Then, patterning (exposure and development) is carried out over the dry film resist 300 to form an opening 310 for forming an electrode which exposes a part of the seed layer 314. Next, electrolytic Cu plating is carried out by feeding the seed layer 314 to deposit Cu in a via hole 312 and the opening 310 for forming an electrode, thereby forming the via 152 and the second electrode pad 160. Then, the dry film resist 300 and the seed layer 314 other than the seed layer 314 provided under the second electrode pad 160 are removed. At steps to be carried out in FIG. 3N and the succeeding drawings, Cu in the seed layer 314 provided under the second electrode pad 160 is integrated. Therefore, the seed layer 314 is omitted.

Figure 3N:
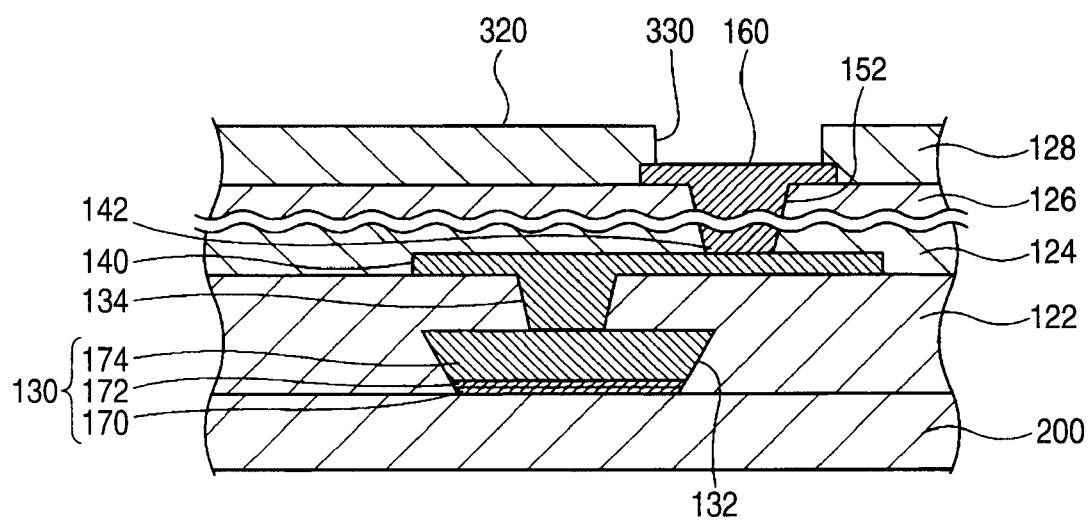
FIG. 3N is a view for explaining a method (No. 14) of manufacturing the wiring board according to the first example.
Figure 30:
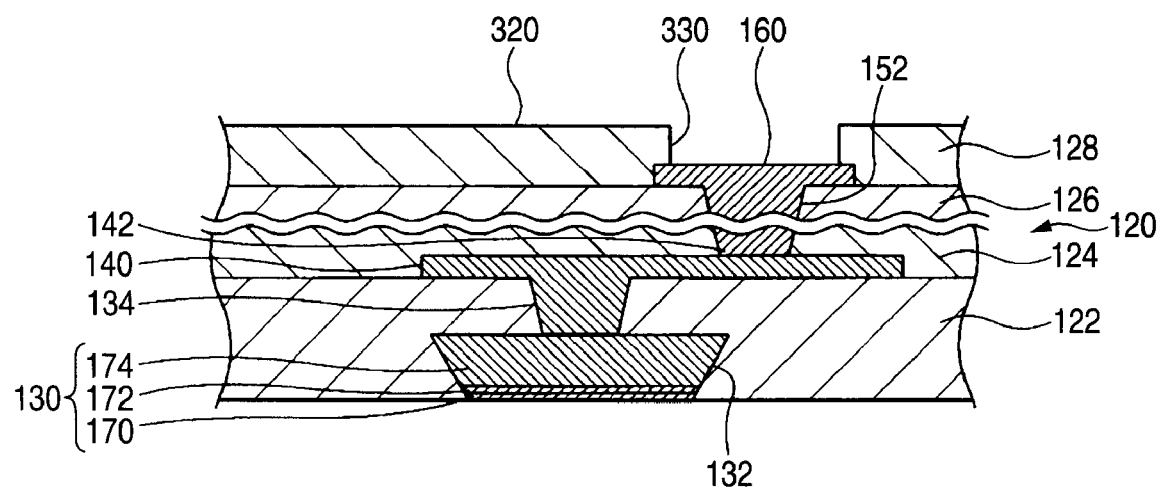

In FIG. 3N, a solder resist 320 is laminated on the surface (upper surface) of the insulating layer of the third layer 126 and the insulating layer of the fourth layer 128 is thus formed, and an opening 330 is then formed in such a manner that a central portion of the second electrode pad 160 is exposed.

In FIG. 3O, the support substrate 200 is removed by wet etching so that the wiring board 120 is obtained. For the support substrate 200, it is also possible to stick two support substrates 200 in a vertical direction and to arrange the wiring board 120 on both surfaces at upper and lower surface sides thereof. In that case, the two support substrates 200 are divided into two parts and are removed by wet etching.

As shown in FIG. 2, then, a solder ball is put on the first electrode pad 130 of the wiring board 120 and a reflow is carried out so that each terminal of the semiconductor chip 110 is connected to the first electrode pad 130 through the solder bump 180 and the semiconductor chip 110 is mounted on the wiring board 120. The step of mounting the semiconductor chip 110 on the wiring board 120 is properly selected. For example, there are the case in which the semiconductor chip 110 is mounted on the wiring board 120 according to a request of a customer and the case in which the semiconductor chip 110 is mounted on the wiring board 120 in a customer to which the wiring board 120 is delivered.

Moreover, the semiconductor chip 110 may be mounted on the wiring board 120 through wire bonding in place of the solder bump 180. Furthermore, the semiconductor chip 110 may be mounted on the wiring board 120 by soldering a pin in place of the solder bump 180.

In the case in which a thermal stress is generated in a reflow of the solder bump 180, moreover, the adhesion of the taper surface 132 to the insulating layer of the first layer 122 is increased because the taper surface 132 having a smaller diameter at the chip mounting side than the substrate laminating side is formed on the outer periphery of the first electrode pad 130. Consequently, a crack can be prevented from being generated. Furthermore, the tapered opening internal wall of the insulating layer of the first layer 122 is formed to cover the whole periphery of the taper surface 132. Therefore, a holding force for the first electrode pad 130 is increased. Even if a force for pulling out the semiconductor chip 110 is applied after the chip is mounted, consequently, the first electrode pad 130 can be prevented from being separated from the insulating layer of the first layer 122.

Figure 4:
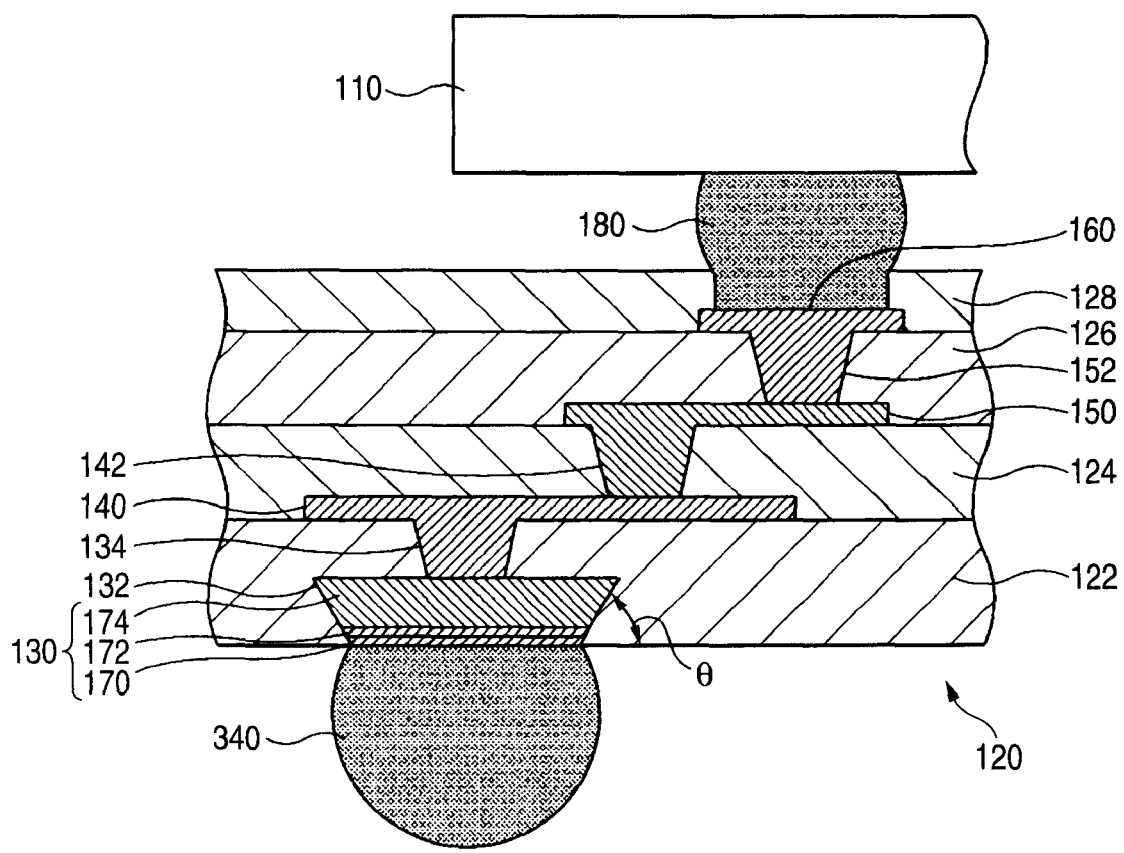
FIG. 4 is a view showing a variant of the first example.

FIG. 4 is a view showing a variant of the first example. As shown in FIG. 4, in the variant, the wiring board 120 is used in a reversely vertical direction to that in the case of the first example. More specifically, the semiconductor chip 110 is mounted on the second electrode pad 160 through the solder bump 180 and a solder bump 340 is formed on the first electrode pad 130 through a reflow of a solder ball. A pin maybe soldered in place of the solder bump 340.

In the variant, the solder bump 340 is connected to the first electrode pad 130. Therefore, a bonding strength obtained by an increase in the adhesion of the taper surface 132 to the insulating layer of the first layer 122 acts on the solder bump 340.

The semiconductor chip 110 may be mounted on either the first electrode pad 130 or the second electrode pad 160 in the wiring board 120 as shown in FIGS. 2 and 4.

In the variant, a plated layer having Au and Ni layers arranged (in such a manner that the Au layer is exposed to a surface) may be provided on the second electrode pad 160. Moreover, it is also possible to use Au/Pd/Ni, Sn/Ni, Sn—Ag (an alloy of tin and silver) and Sn in place of the Au layer 170 and the Ni layer 172. Furthermore, the first electrode pad 130 may be formed by only the metals. In addition, it is a matter of course that each metal is not restricted to the metals but is usable and a combination of the respective metals is not restricted to the combination.

In the variant, furthermore, it is also possible to finish the semiconductor device by loading the semiconductor chip 110 onto the wiring board 120 and then removing the support substrate 200 at the step of FIG. 3N.

Also in the variant, an underfill resin having an insulating property may be filled between the semiconductor chip 110 and the wiring board 120.

Moreover, the semiconductor chip 110 may be mounted on the wiring board 120 through wire bonding in place of the solder bump 180. Furthermore, the semiconductor chip 110 may be mounted on the wiring board 120 by soldering a pin in place of the solder bump 180.

SECOND EXAMPLE

Figure 1:
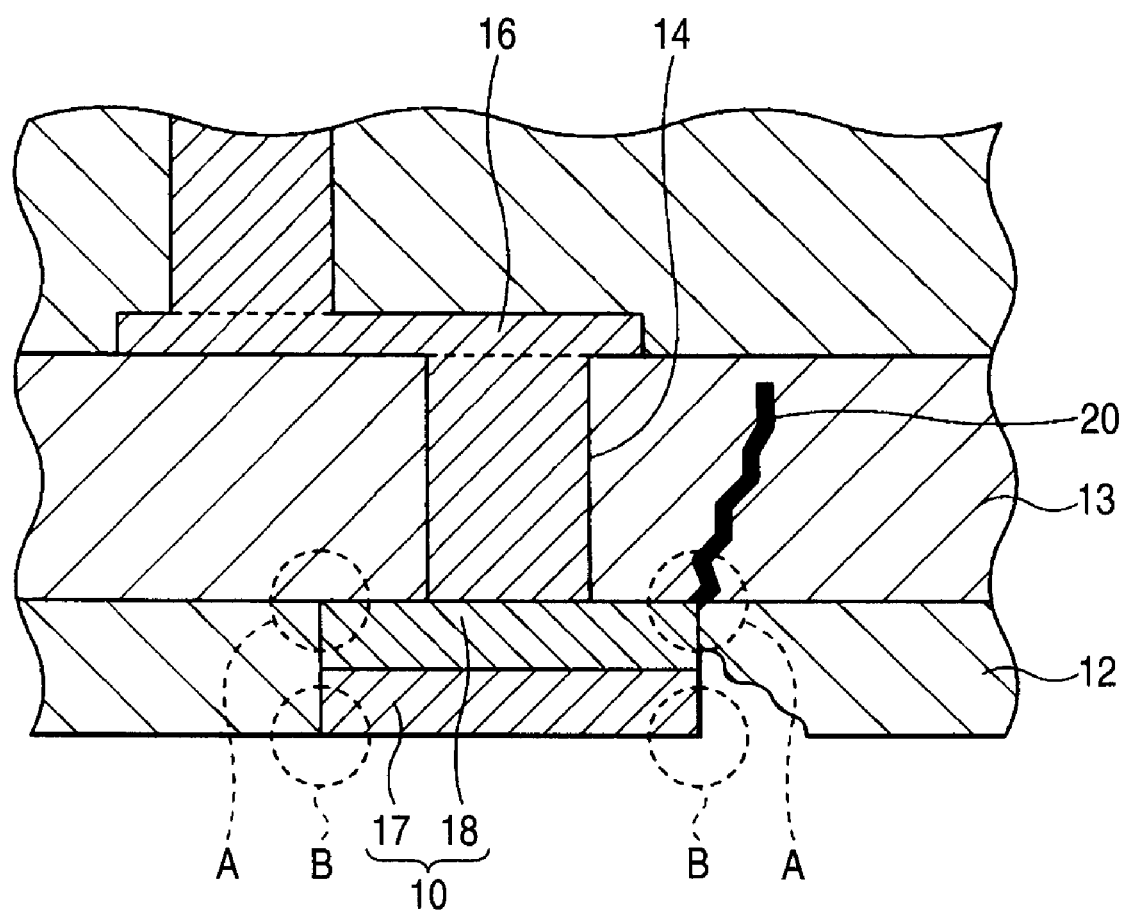
FIG. 1 is a view showing an example of a structure of a conventional wiring board.
Figure 5:
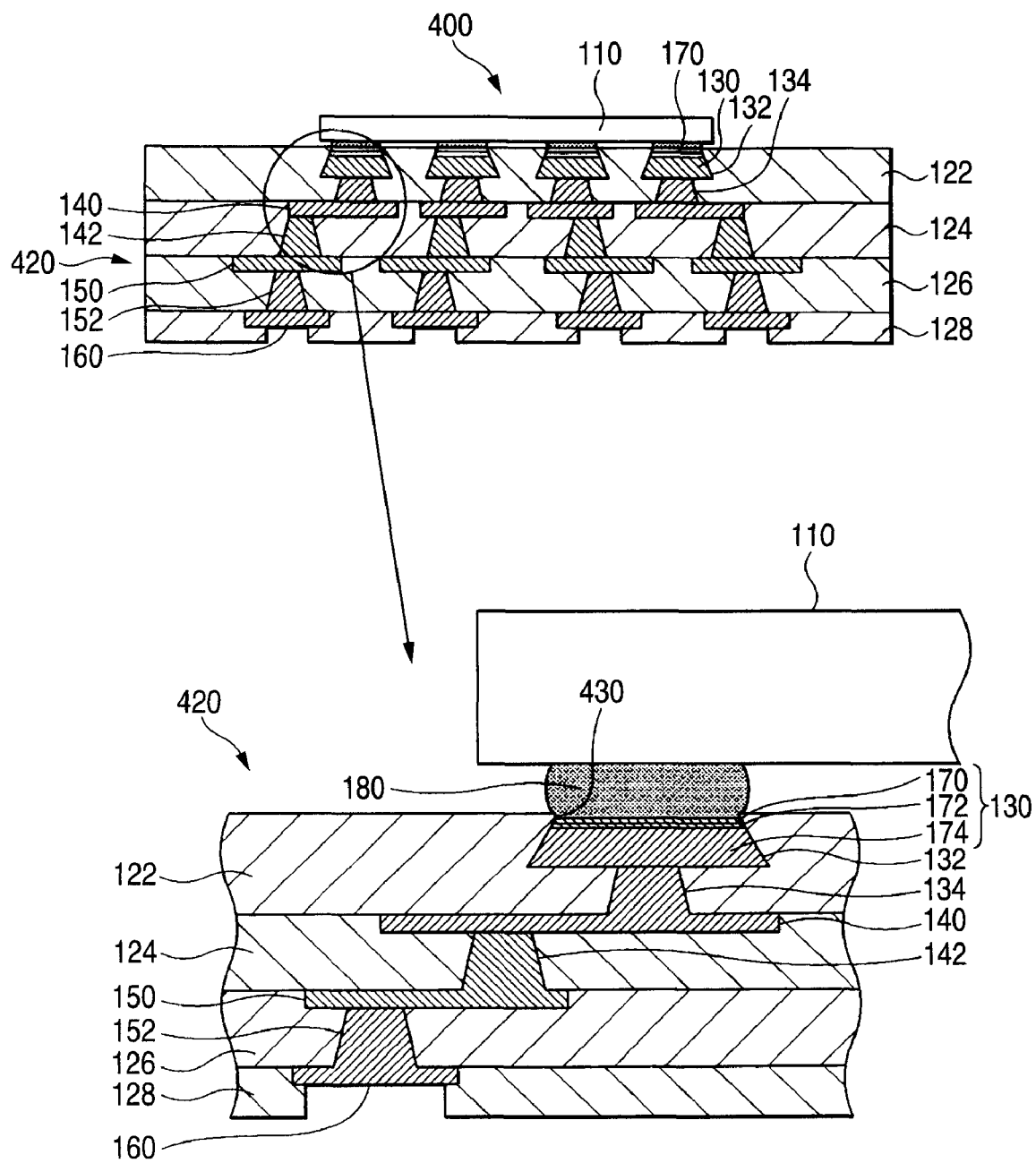
FIG. 5 is a longitudinal sectional view showing a semiconductor device to which a second example of the wiring board is applied.

FIG. 5 is a longitudinal sectional view showing a semiconductor device to which a second example of the wiring board is applied. In FIG. 5, the same portions as those in FIG. 1 have the same reference numerals and description thereof will be omitted.

As shown in FIG. 5, in a wiring board 420 to be used in a semiconductor device 400 according to the second example, there is formed an electrode opening 430 in which a surface of a first electrode pad 130 (an end face on an Au layer 170 side) is tapered and concaved from a surface of an insulating layer of a first layer 122. Therefore, a solder bump 180 is formed on the Au layer 170 side by carrying out a reflow (a heat treatment) with a solder ball inserted in the electrode opening 430.

In the semiconductor device 400 according to the second example, an underfill resin having an insulating property may be filled between a semiconductor chip 110 and the wiring board 420. Moreover, it is also possible to use Au/Pd/Ni, Sn/Ni, Sn—Ag (an alloy of tin and silver) and Sn in place of the Au layer 170 and an Ni layer 172. Furthermore, the first electrode pad 130 may be formed by only the metals. In addition, it is a matter of course that each metal is not restricted to the metals but is usable and a combination of the respective metals is not restricted to the combination.

Figure 6A:
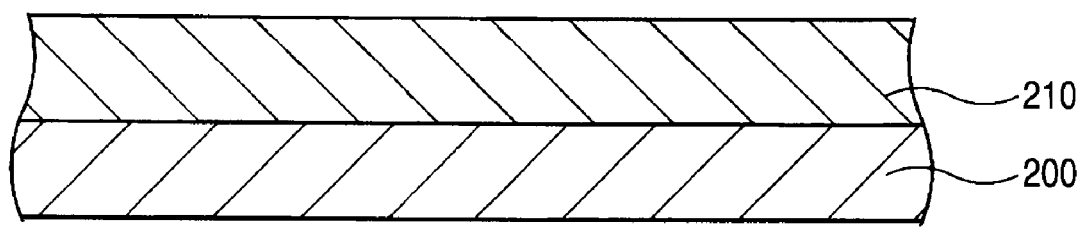
FIG. 6A is a view for explaining a method (No. 1) of manufacturing the wiring board according to the second example.

A method of manufacturing the wiring board 420 to be used in the semiconductor device 400 will be described with reference to FIGS. 6A to 6O. FIGS. 6A to 6O are views for explaining methods (Nos. 1 to 15) of manufacturing the wiring board 420 according to the second example. 5

In FIG. 6A, first of all, there is prepared a support substrate 200 formed by a flat Cu plate or a Cu foil which has a predetermined thickness. A dry film resist is laminated as a plating resist on an upper surface of the support substrate 200 to form a resist layer 210. Moreover, it is also possible to apply a liquid resist in place of the dry film resist, thereby forming the resist layer 210.

Figure 6B:
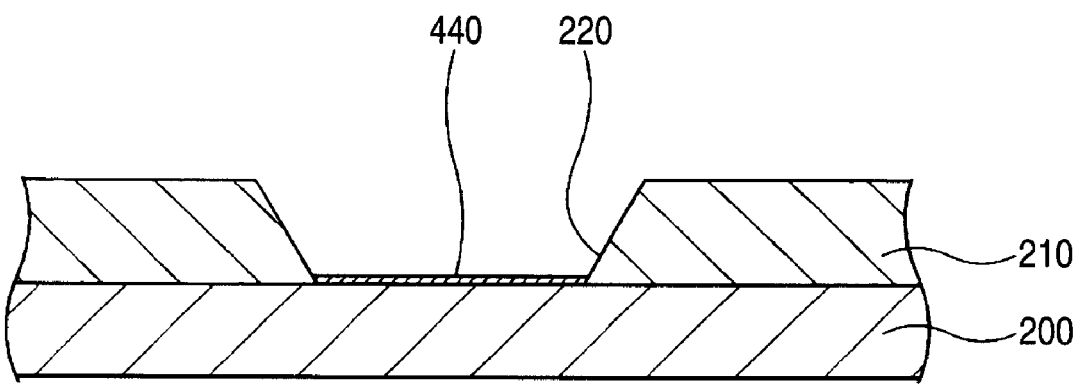
FIG. 6B is a view for explaining a method (No. 2) of manufacturing the wiring board according to the second example.

In FIG. 6B, a tapered opening 220 for forming a first electrode which exposes a part of the support substrate 200 by an exposure is formed on the resist layer 210. The support substrate 200 is used as a feeding layer to carry out electrolytic Cu plating over an inside of the tapered opening 220 for forming a first electrode so that Cu is deposited on 29 the support substrate 200 in the tapered opening 220 for forming a first electrode and a Cu layer 440 is thus arranged.

Figure 6C:
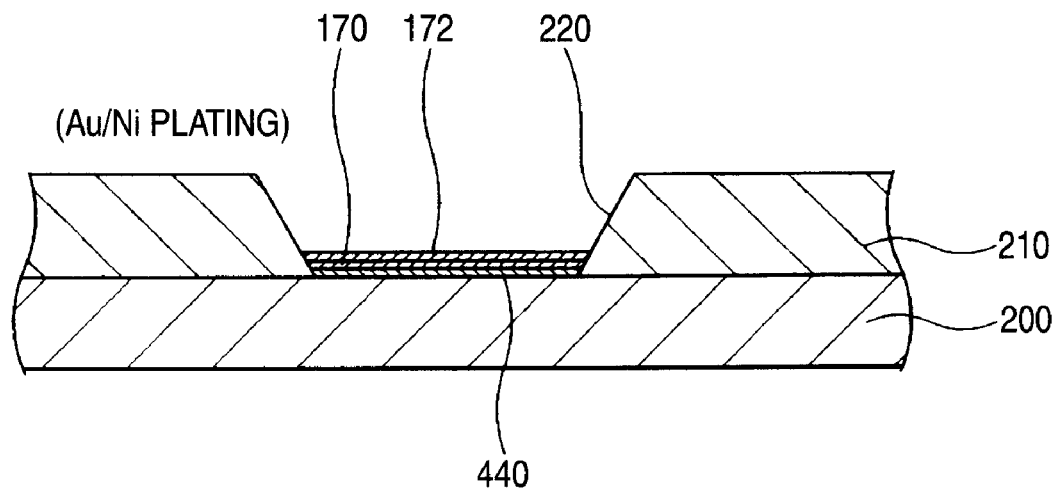
FIG. 6C is a view for explaining a method (No. 3) of manufacturing the wiring board according to the second example.

In FIG. 6C, the support substrate 200 is used as a feeding layer to carry out electrolytic plating so that Au is deposited on the Cu layer 440 in the tapered opening 220 for forming a first electrode pad and the Au layer 170 is thus formed, and furthermore, Ni is deposited on the surface of the Au layer 170 to arrange the Ni layer 172.

Figure 6D:
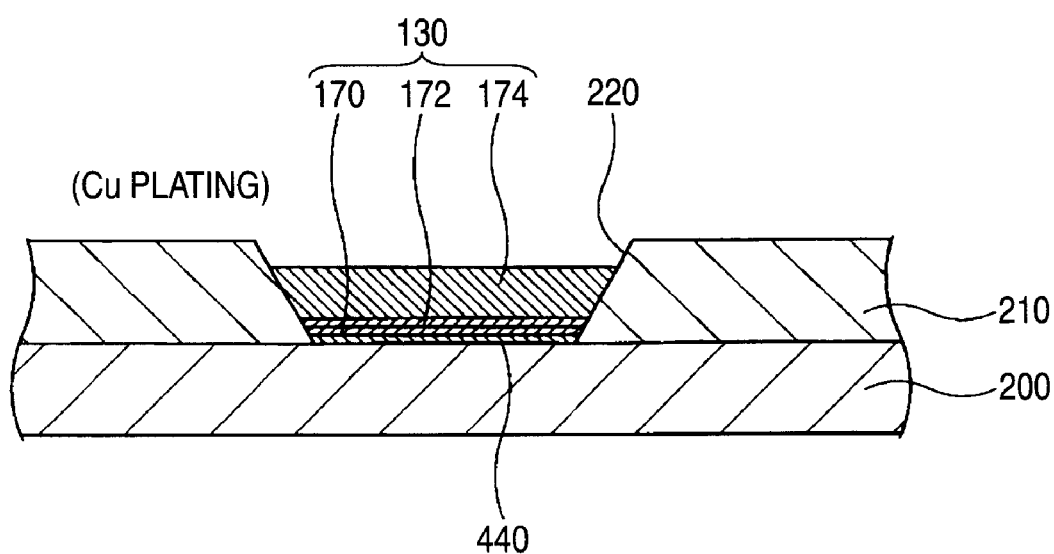
FIG. 6D is a view for explaining a method (No. 4) of manufacturing the wiring board according to the second example.

In FIG. 6D, furthermore, the support substrate 200 is used as the feeding layer to carry out electrolytic Cu plating so that Cu is deposited on the Ni layer 172 in the tapered opening 220 for forming a first electrode and the Cu layer 174 is thus arranged. Consequently, the Cu layer 440 and the first electrode pad 130 constituted by the Au layer 170, the Ni layer 172 and the Cu layer 174 are formed in the tapered opening 220 for forming a first electrode pad.

Figure 6E:
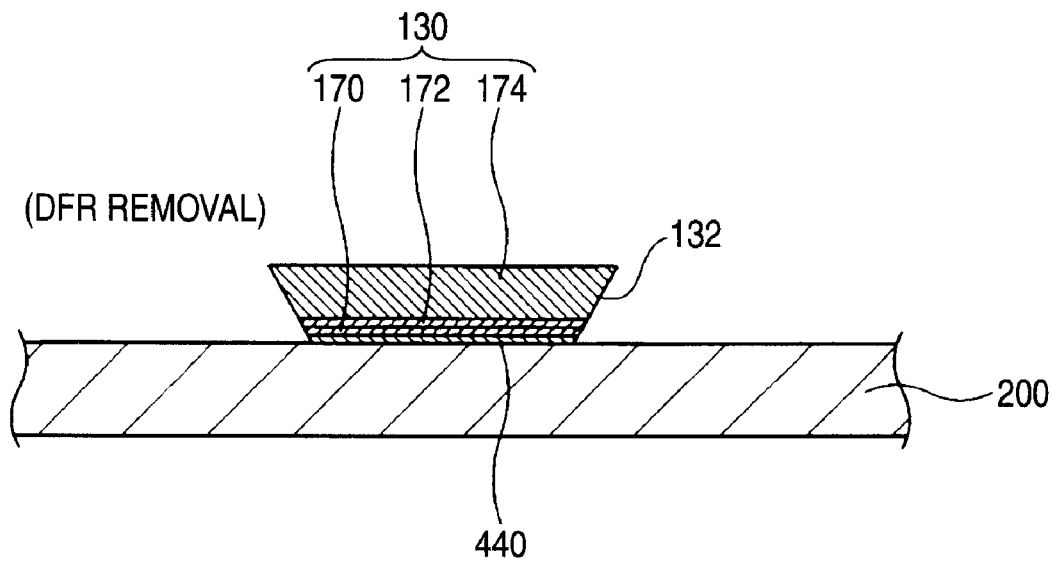
FIG. 6E is a view for explaining a method (No. 5) of manufacturing the wiring board according to the second example.
Figure 6F:
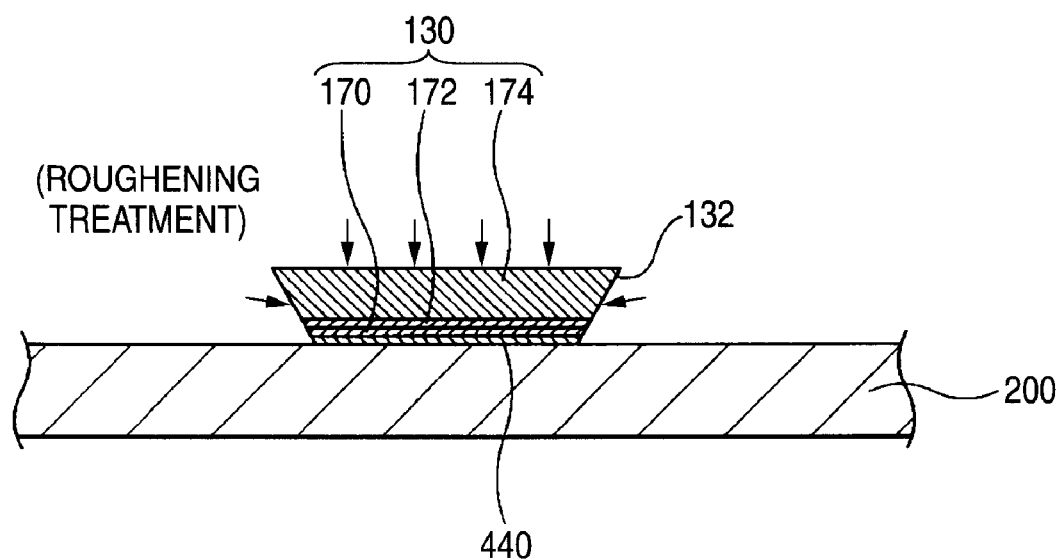
FIG. 6F is a view for explaining a method (No. 6) of manufacturing the wiring board according to the second example.
Figure 6G:
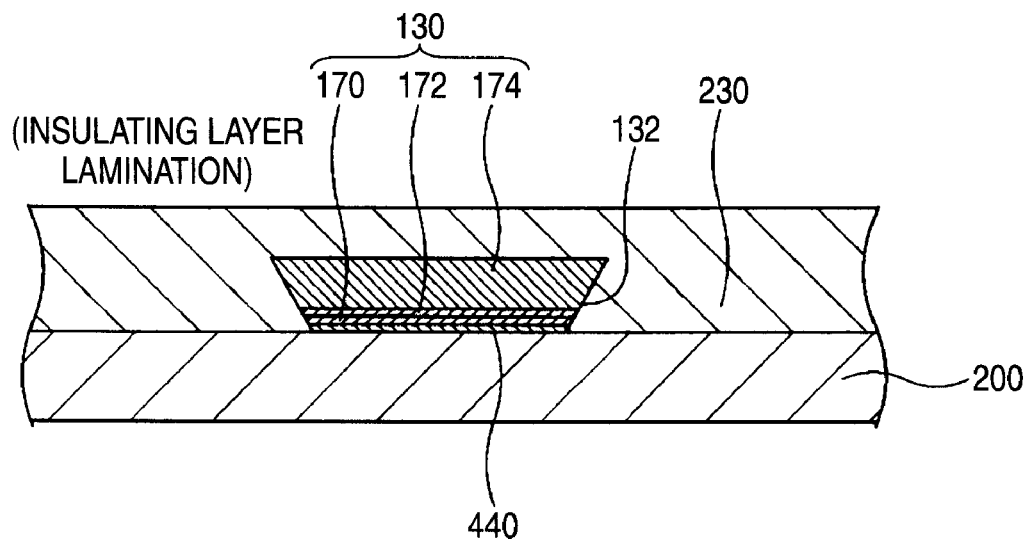
FIG. 6G is a view for explaining a method (No. 7) of manufacturing the wiring board according to the second example.
Figure 6H:
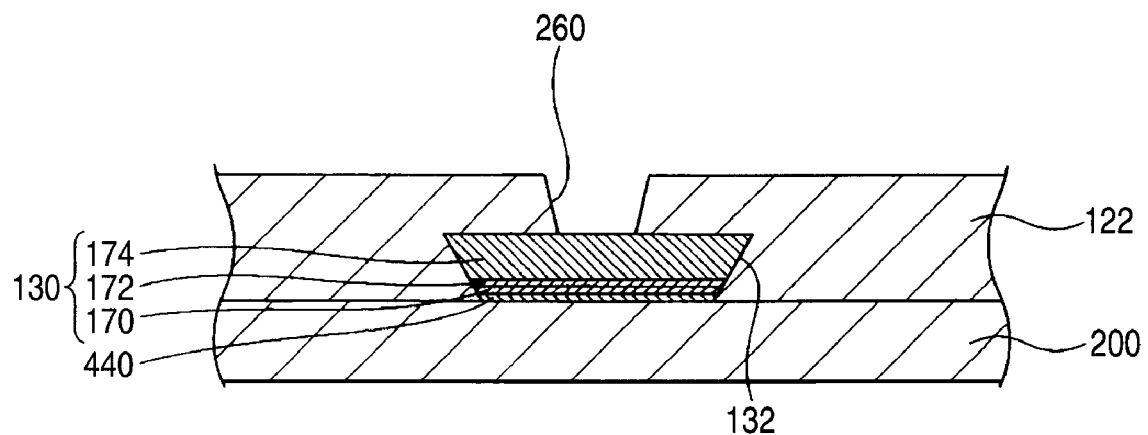
FIG. 6H is a view for explaining a method (No. 8) of manufacturing the wiring board according to the second example.
Figure 6I:
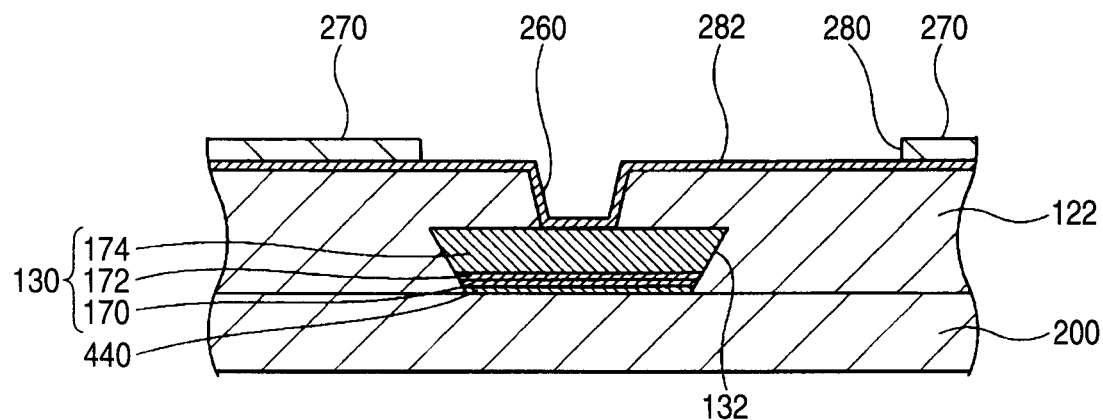
FIG. 6I is a view for explaining a method (No. 9) of manufacturing the wiring board according to the second example.
Figure 6J:
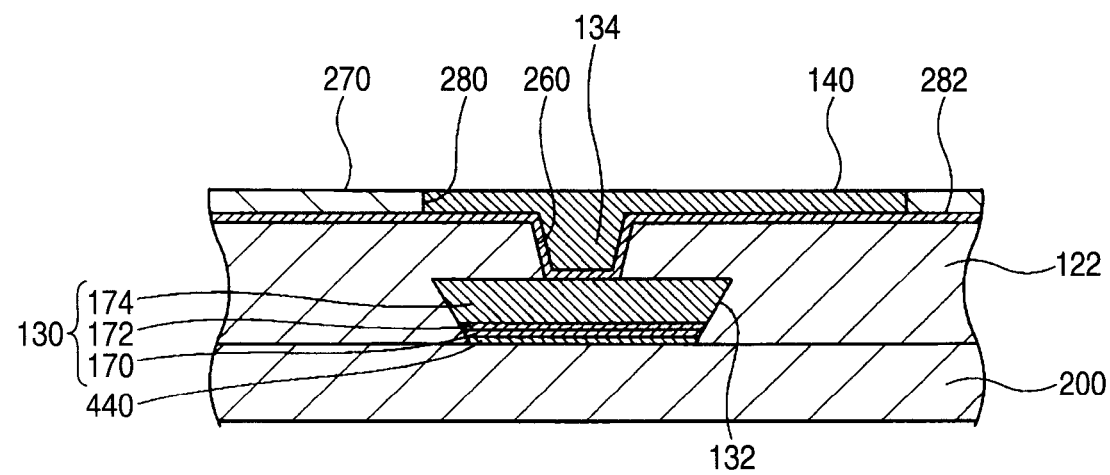
FIG. 6J is a view for explaining a method (No. 10) of manufacturing the wiring board according to the second example.
Figure 6K:
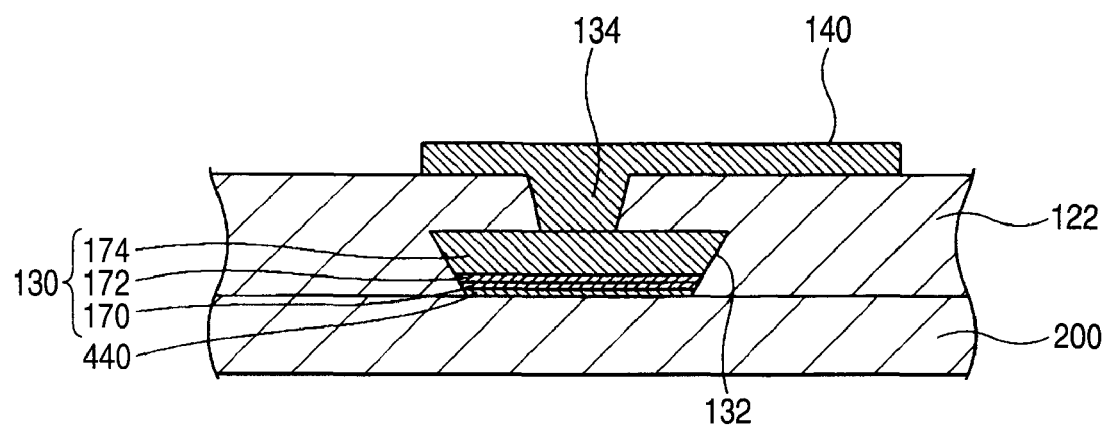
FIG. 6K is a view for explaining a method (No. 11) of manufacturing the wiring board according to the second example.
Figure 6L:
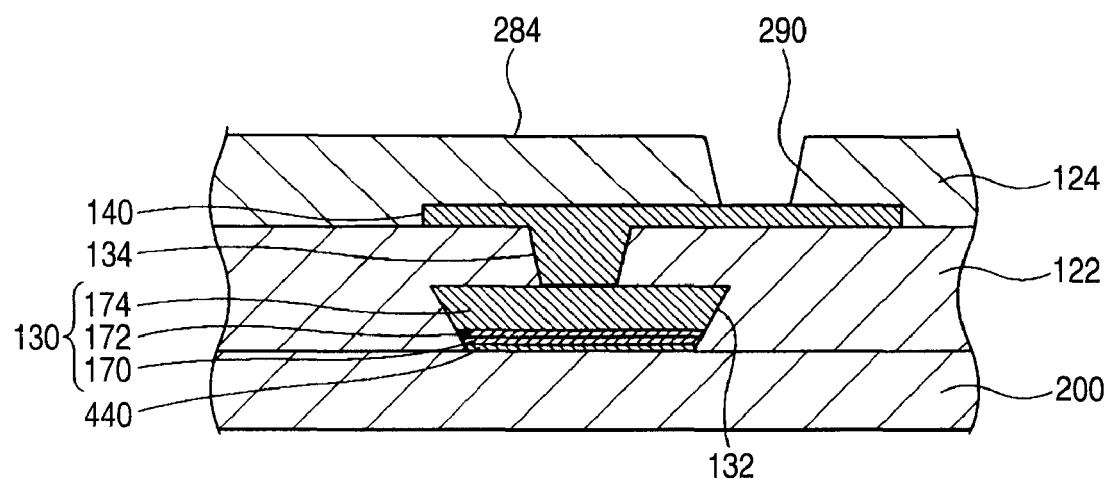
FIG. 6L is a view for explaining a method (No. 12) of manufacturing the wiring board according to the second example.
Figure 6M:
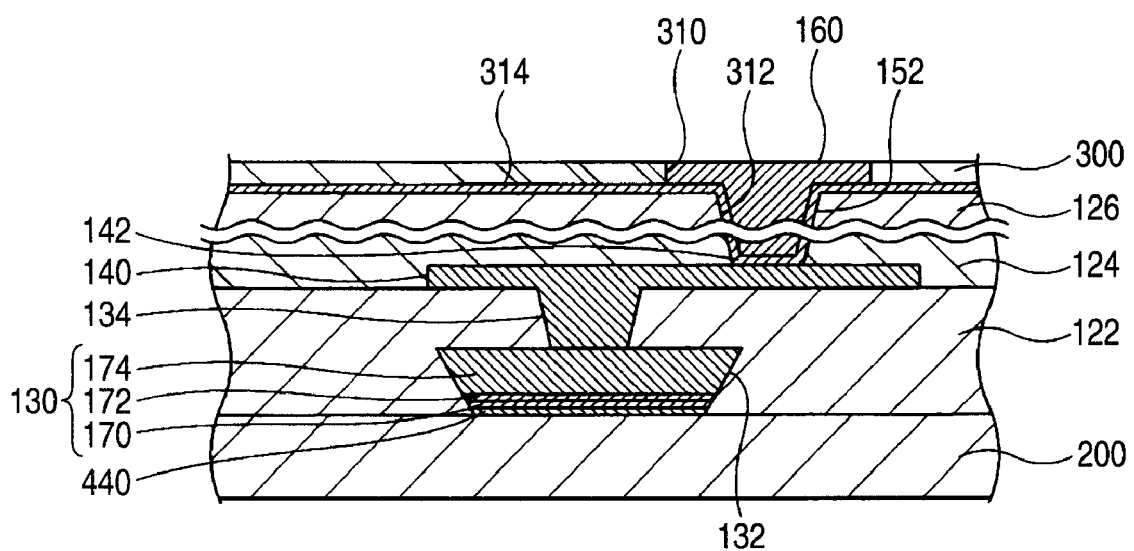
FIG. 6M is a view for explaining a method (No. 13) of manufacturing the wiring board according to the second example.

In FIG. 6E, the resist layer 210 is removed from the support substrate 200 so that the Cu layer 440 and the first electrode pad 130 are left on the support substrate 200 in a taper laminating state.

Since the same processings as those of the steps shown in FIGS. 3F to 3N according to the first example are executed at the steps shown in FIGS. 6F to 6N, description thereof will be omitted.

In FIG. 6O, the support substrate 200 is removed by wet etching, and furthermore, the Cu layer 440 is also removed so that the wiring board 420 is obtained. In the wiring board 420 according to the second example, the Cu layer 440 is removed so that the tapered electrode opening 430 is formed on a lower surface side (a chip mounting side).

For the support substrate 200, it is also possible to stick two support substrates 200 in a vertical direction and to arrange the wiring board 420 on both surfaces at upper and lower surface sides thereof. In that case, the two support substrates 200 are divided into two parts and are removed by wet etching.

As shown in FIG. 5, then, a solder ball is put on the Au layer 170 of the electrode opening 430 and a reflow is carried out so that each terminal of the semiconductor chip 110 is connected to the first electrode pad 130 through the solder bump 180 and the semiconductor chip 110 is mounted on the wiring board 420. The step of mounting the semiconductor chip 110 on the wiring board 420 is properly selected. For example, there are the case in which the semiconductor chip 110 is mounted on the wiring board 420 according to a request of a customer and the case in which the semiconductor chip 110 is mounted on the wiring board 420 in a customer to which the wiring board 420 is delivered.

In the wiring board 420 according to the second example, thus, the electrode opening 430 is formed on the lower surface side (the chip mounting side). When the semiconductor chip 110 is to be mounted, therefore, the solder bump 180 is bonded to the Au layer 170 side of the first electrode pad 130 by carrying out a reflow (a heat treatment) over the electrode opening 430. Consequently, the solder bump 180 is reliably bonded to the first electrode pad 130 and a bonding strength in the radial direction is also increased by a peripheral edge portion of the electrode opening 430.

Moreover, the semiconductor chip 110 may be mounted on the wiring board 420 through wire bonding in place of the solder bump 180. Furthermore, the semiconductor chip 110 may be mounted on the wiring board 420 by soldering a pin in place of the solder bump 180.

In the case in which a thermal stress is generated in the reflow of the solder bump 180, moreover, an adhesion of the taper surface 132 to the insulating layer of the first layer 122 is increased because the taper surface 132 having a small diameter at the chip mounting side than the substrate laminating side is formed on the outer periphery of the first electrode pad 130 in the same manner as in the first example. Consequently, a crack can be prevented from being generated.

Furthermore, a tapered opening internal wall of the insulating layer of the first layer 122 is formed to cover the whole periphery of the taper surface 132. Therefore, a holding force for the first electrode pad 130 is increased. Even if a force for pulling out the semiconductor chip 110 is applied after the chip is mounted, consequently, the first electrode pad 130 can be prevented from being separated from the insulating layer of the first layer 122.

Figure 7:
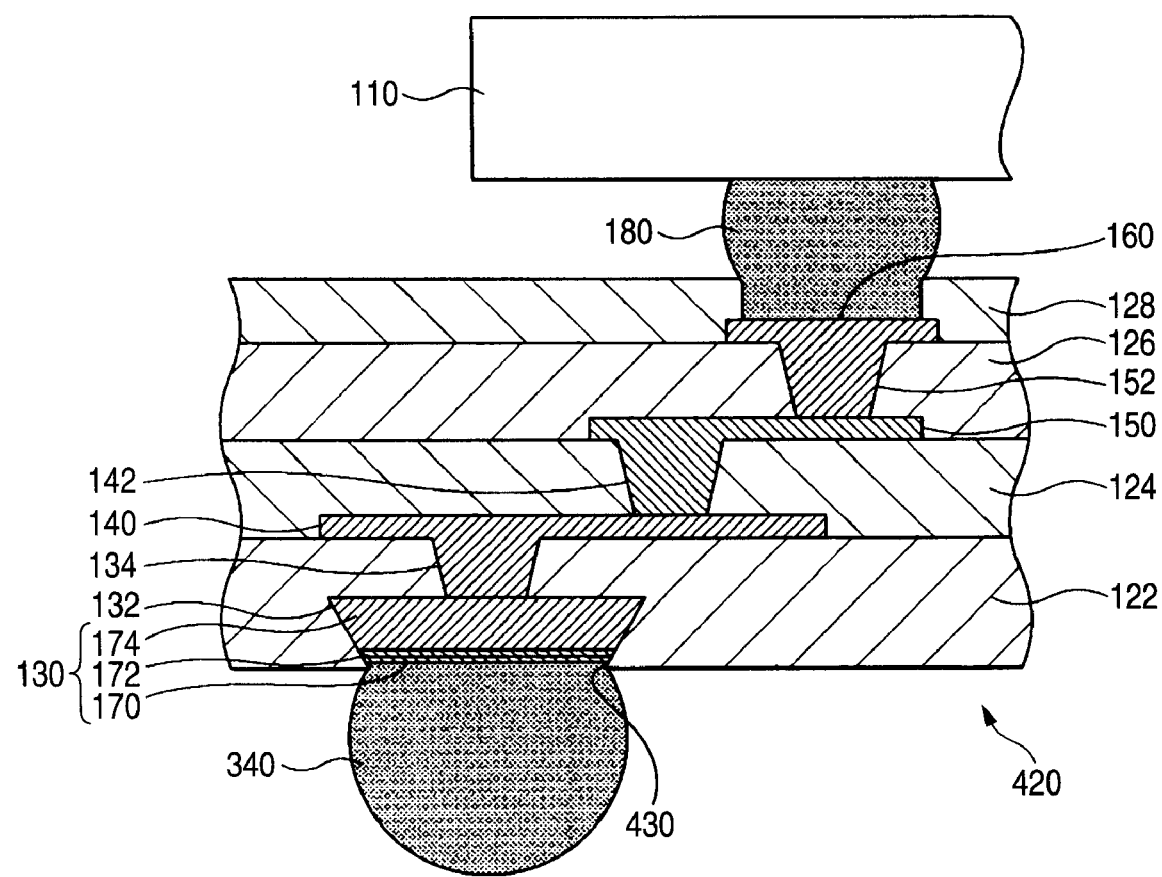
FIG. 7 is a view showing a variant of the second example.

FIG. 7 is a view showing a variant of the second example. As shown in FIG. 7, in the variant, the wiring board 420 is used in a reversely vertical direction to that in the case of the second example. More specifically, the semiconductor chip 110 is mounted on the second electrode pad 160 through the solder bump 180 and a solder bump 340 is formed on the first electrode pad 130 through a reflow of a solder ball. In this case, a bonding strength in a radial direction of the solder bump 340 can be increased through a peripheral edge portion of the electrode opening 430. A pin may be soldered in place of the solder bump 340.

The semiconductor chip 110 may be mounted on either the first electrode pad 130 or the second electrode pad 160 in the wiring board 420 as shown in FIGS. 5 and 7.

In the variant, a plated layer having Au and Ni layers arranged (in such a manner that the Au layer is exposed to a surface) may be provided on the second electrode pad 160. Moreover, it is also possible to use Au/Pd/Ni, Sn/Ni, Sn—Ag (an alloy of tin and silver) and Sn in place of the Au layer 170 and the Ni layer 172. Furthermore, the first electrode pad 130 may be formed by only the metals. In addition, it is a matter of course that each metal is not restricted to the metals but is usable and a combination of the respective metals is not restricted to the combination.

Figure 6N:
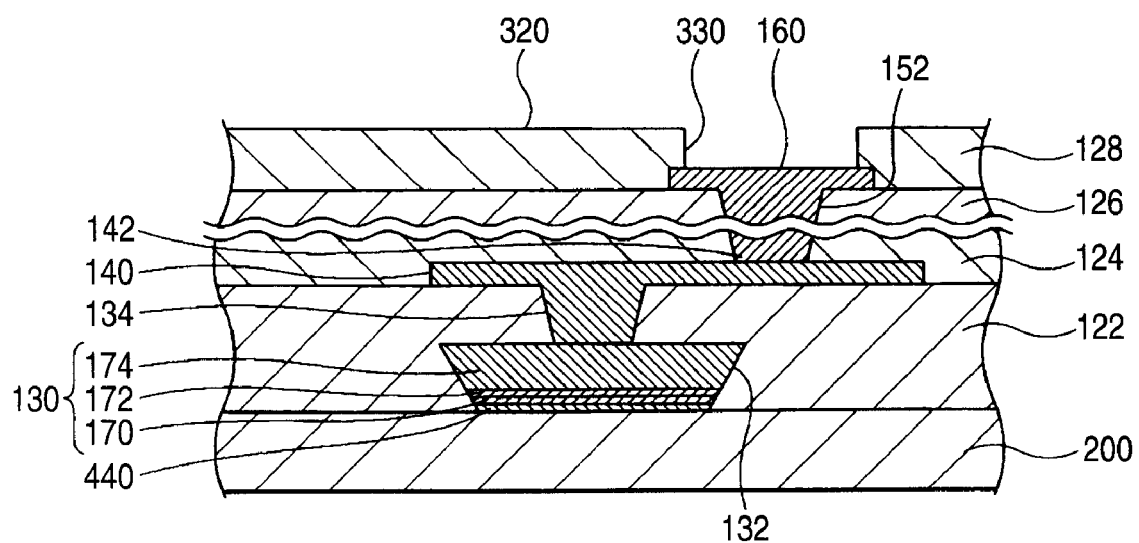
FIG. 6N is a view for explaining a method (No. 14) of manufacturing the wiring board according to the second example.
Figure 6O:
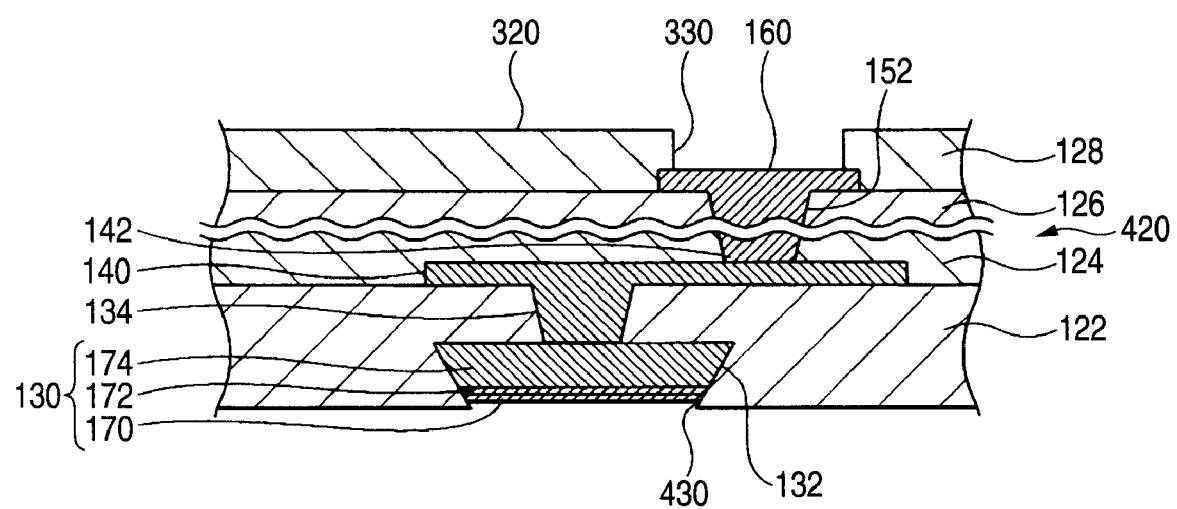
FIG. 6O is a view for explaining a method (No. 15) of manufacturing the wiring board according to the second example.

In the variant, furthermore, it is also possible to finish the semiconductor device by loading the semiconductor chip 110 onto the wiring board 420 and then removing the support substrate 200 at the step of FIG. 6N.

Also in the variant, an underfill resin having an insulating property may be filled between the semiconductor chip 110 and the wiring board 420.

Moreover, the semiconductor chip 110 may be mounted on the wiring board 420 through wire bonding in place of the solder bump 180. Furthermore, the semiconductor chip 110 may be mounted on the wiring board 420 by soldering a pin in place of the solder bump 180.

THIRD EXAMPLE

Figure 8:
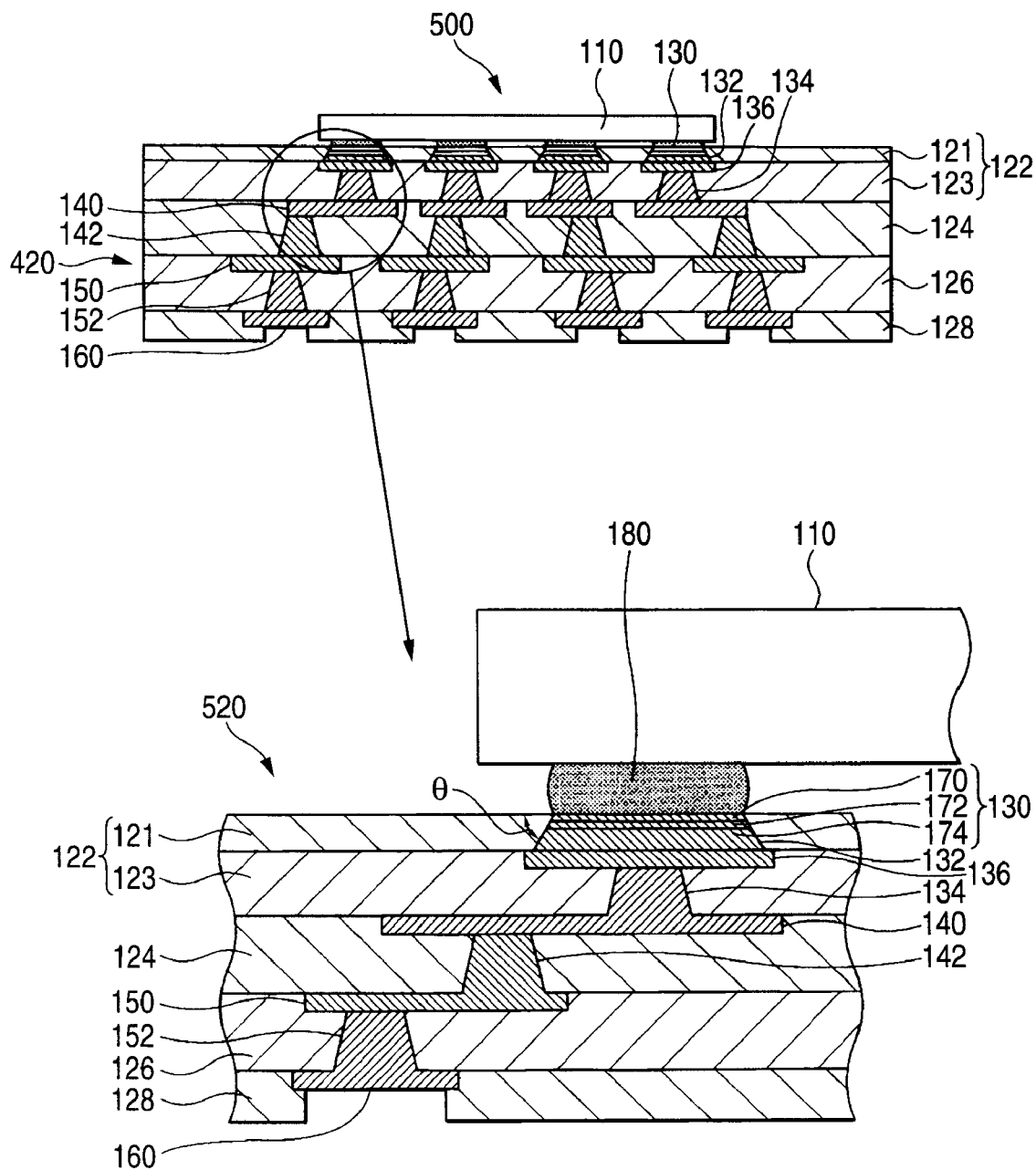
FIG. 8 is a longitudinal sectional view showing a semiconductor device to which a third example of the wiring board according to the invention is applied.

FIG. 8 is a longitudinal sectional view showing a S emiconductor device to which a third example of a wiring board according to the invention is applied. As shown in FIG. 8, a semiconductor device 500 has such a structure that a semiconductor chip 110 is flip-chip mounted on a wiring board 520, for example. The wiring board 520 has a multilayer structure in which a plurality of wiring layers and a plurality of insulating layers are arranged, and has a structure in which respective insulating layers of a first layer 122, a second layer 124, a third layer 126 and a fourth layer 128 which have wiring layers are arranged in a vertical direction according to the example. Moreover, the first layer 122 has such a structure that a first insulating layer 121 and a second insulating layer 123 are arranged to carry out a step of providing a wide third electrode pad 136 on a first electrode pad 130. Each of the insulating layers is formed by an insulating resin such as an epoxy resin or a polyimide resin.

The first insulating layer 121 and the insulating layer of the fourth layer 128 over which a solder connection is to be carried out may be formed by an insulating resin constituted by a thermosetting epoxy resin film. In the semiconductor device 500, moreover, an underfill resin having an insulating property may be filled between the semiconductor chip 110 and the wiring board 520.

The first layer 122 in an uppermost stage is provided with the first electrode pad 130, the third electrode pad 136 and a via 134 to which a terminal of the semiconductor chip 110 is to be flip-chip connected. Moreover, the second layer 124 arranged under the first layer 122 is provided with a wiring layer 140 and a via 142 which are conducted to the via 134. Furthermore, the third layer 126 arranged under the second layer 124 has a wiring layer 150 and a via 152 which are conducted to the via 142. In addition, the fourth layer 128 arranged under the third layer 126 has a second electrode pad 160 conducted to the via 152.

Moreover, the first layer 122 has the first insulating layer 121 formed to surround an outer periphery of the first electrode pad 130, and the third electrode pad 136 is formed between the first insulating layer 121 and the second insulating layer 123.

In the same manner as in the first and second examples, the first electrode pad 130 is formed in such a manner that an outside diameter at an upper surface side (a solder connecting side and a chip mounting side) is small and that at a lower surface side (a substrate laminating side) is large. Therefore, an outer peripheral surface forms a taper surface 132. In the example, a gradient is set in such a manner that a gradient angle $\theta$ of the taper surface 132 of the first electrode pad 130 (a tilt angle to a horizontal plane) is set to be $\theta=50$ to 80 degrees. The gradient angle $\theta$ is not restricted thereto but it is also possible to set the gradient angle $\theta$ to be an optional angle which is smaller than 50 degrees or is equal to or greater than 80 degrees.

The first electrode pad 130 has a three-layer structure in which Au, Ni and Cu layers 170, 172 and 174 having a high bonding property to a solder are arranged. The Au layer 170 is exposed from the upper surface side of the wiring board 120 (a semiconductor chip mounting side), and a solder bump 180 of the semiconductor chip 110 is connected to the Au layer 170.

A terminal of the semiconductor chip 110 is soldered to the Au layer 170 through the solder bump 180 and is thus conducted to the first electrode pad 130. The solder bump 180 is formed by putting a solder ball on the first electrode pad 130 and carrying out a reflow (a heat treatment).

The third electrode pad 136 which is wider than the first electrode pad 130 is formed on a boundary surface between the first insulating layer 121 and the second insulating layer 123. The third electrode pad 136 is formed widely to be protruded from an outside diameter of the first electrode pad 130 in a radial direction (a planar direction). In the example, when the first electrode pad 130 has a diameter of approximately 70 to 100 μm and has a thickness of approximately 15 μm (±10 μm), the third electrode pad 136 is formed to have a diameter increased by approximately 20 to 90% (suitably 50 to 80%) of the diameter of the first electrode pad 130 and a thickness of approximately 2 to 15 μm (suitably 5 μm), for instance.

The third electrode pad 136 which is wider than the first electrode pad 130 is provided between the first electrode pad 130 and the via 134. Therefore, a direction of advance of the thermal stress through the reflow treatment is blocked by the third electrode pad 136 and is absorbed in a direction along the boundary surface between the first insulating layer 121 and the second insulating layer 123, for example. Even if a delamination is generated so that a part of the first insulating layer 121 covering the outer periphery of the first electrode pad 130 is broken off, therefore, it is possible to prevent a crack from being generated on the second insulating layer 123.

The first electrode pad 130 may have a structure in which only the Au layer 170 and the Ni layer 172 are arranged in such a manner that the Au layer 170 is exposed to the surface of the wiring board 520. Moreover, Au/Pd/Ni, Sn/Ni, Sn—Ag (an alloy of tin and silver) and Sn can also be used in place of the Au layer 170 and the Ni layer 172. Furthermore, the first electrode pad 130 may be formed of only the metals. In addition, it is a matter of course that each of the metals can be used without a restriction and a combination of the respective metals is not restricted to the combination.

Figure 9A:
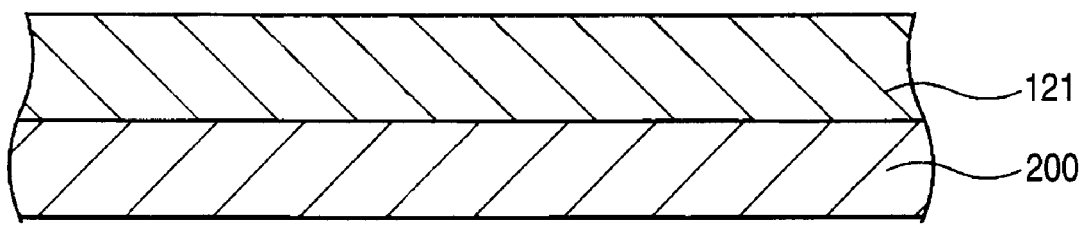
FIG. 9A is a view for explaining a method (No. 1) of manufacturing the wiring board according to the third example.

A method of manufacturing the wiring board 520 to be used in the semiconductor device 500 will be described with reference to FIGS. 9A to 9S. FIGS. 9A to 9S are views for explaining methods (Nos. 1 to 20) of manufacturing the wiring board 520 according to the third example. In FIGS. 9A to 9S, the respective layers are arranged in a facedown direction in which the first electrode pad 130 is provided on a lower surface side of the wiring board 520 (a vertically reverse direction to the lamination structure shown in FIG. 8).

In FIG. 9A, first of all, there is prepared a support substrate 200 formed by a flat Cu plate or a Cu foil which has a predetermined thickness. A thermosetting epoxy resin film is laminated as a plating resist on an upper surface of the support substrate 200. Consequently, the first insulating layer 121 is formed.

Figure 9B:
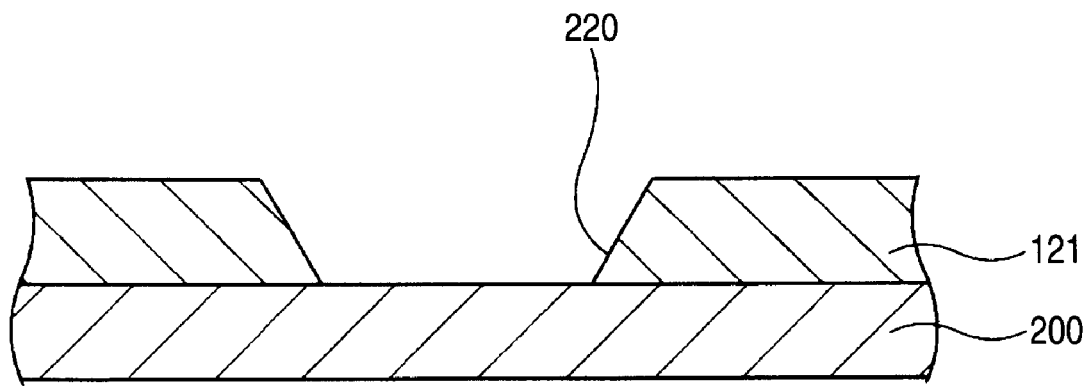
FIG. 9B is a view for explaining a method (No. 2) of manufacturing the wiring board according to the third example.

In FIG. 9B, a laser beam is irradiated on the first insulating layer 121 to form a tapered opening 220 for forming a first electrode pad so as to expose a part of the support substrate 200. An inside diameter of the tapered opening 220 for forming a first electrode pad corresponds to an outside diameter of the first electrode pad 130.

Figure 9C:
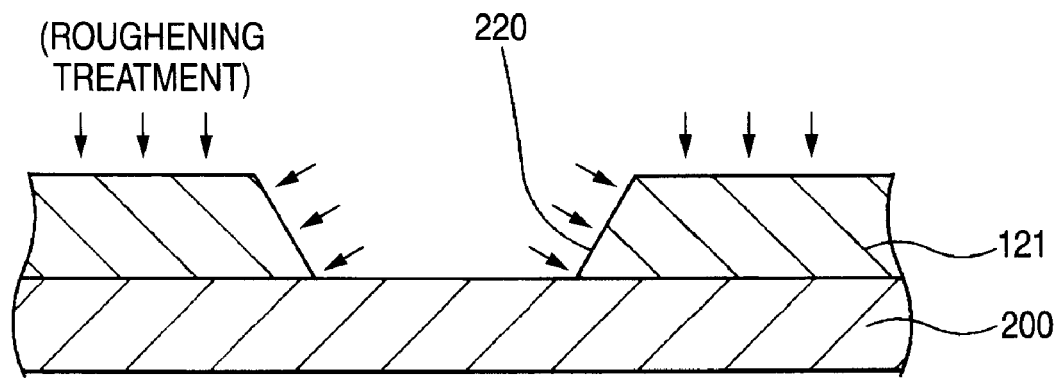
FIG. 9C is a view for explaining a method (No. 3) of manufacturing the wiring board according to the third example.

In FIG. 9C, a roughening treatment is carried out over the first insulating layer 121 and an internal wall of the tapered opening 220 for forming a first electrode pad. It is preferable that a surface roughness obtained by the roughening treatment should be set to have Ra=approximately 0.25 to 0.75 μm, for example.

Figure 9D:
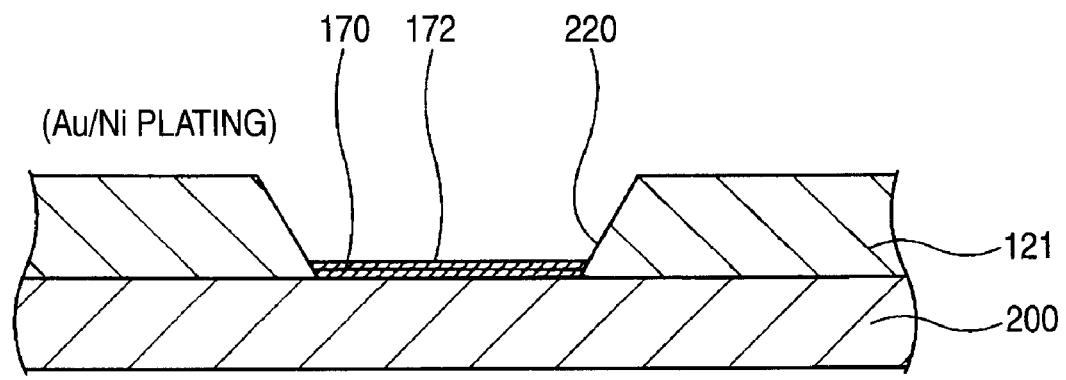
FIG. 9D is a view for explaining a method (No. 4) of manufacturing the wiring board according to the third example.

In FIG. 9D, an electric power is fed to the support substrate 200 to carry out electrolytic plating so that Au is deposited on the support substrate 200 in the tapered opening 220 for forming a first electrode pad to form the Au layer 170, and furthermore, Ni is deposited on the surface of the Au layer 170 to arrange the Ni layer 172.

Figure 9E:
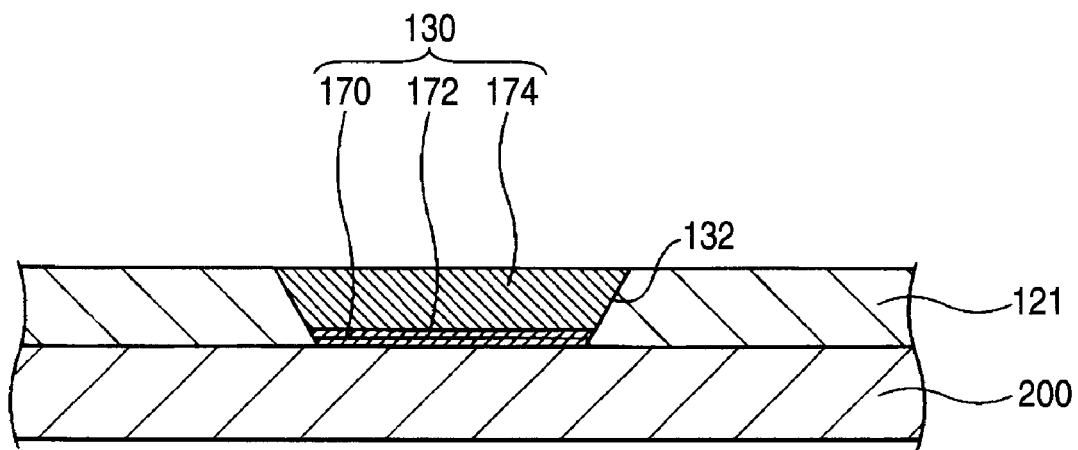
FIG. 9E is a view for explaining a method (No. 5) of manufacturing the wiring board according to the third example.

In FIG. 9E, the electric power is fed to the support substrate 200 to carry out the electrolytic plating so that Cu is deposited on the Ni layer 172 in the tapered opening 220 for forming a first electrode pad and the Cu layer 174 is thus arranged to form the first electrode pad 130. Consequently, the first electrode pad 130 having the three-layer structure including the Au layer 170, the Ni layer 172 and the Cu layer 174 is formed in the tapered opening 220 for forming a first electrode pad. The tapered internal wall of the tapered opening 220 for forming a first electrode pad is roughened. Therefore, it is possible to enhance an adhesion to the first electrode pad 130 and to prevent a delamination from being generated by a thermal stress.

Moreover, it is also possible to use a metal such as Au/Pd/Ni, Sn/Ni, Sn—Ag (an alloy of tin and silver) and Sn in place of the Au layer 170 and the Ni layer 172. Furthermore, the surface of the first insulating layer 121 may be subjected to buffing in such a manner that the upper surface of the first electrode pad 130 is exposed to the first insulating layer 121.

Figure 9F:
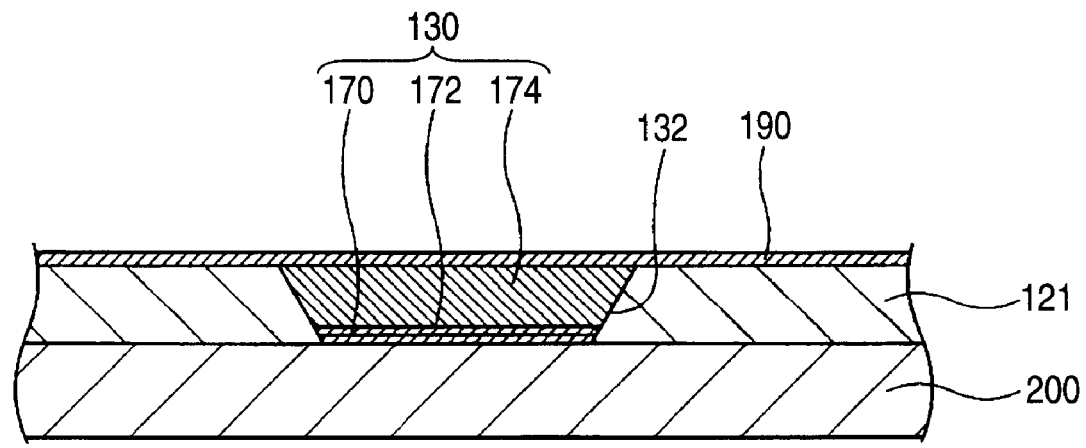
FIG. 9F is a view for explaining a method (No. 6) of manufacturing the wiring board according to the third example.

In FIG. 9F, a seed layer 190 is formed, by noneletrolytic Cu plating, on the surfaces of the first electrode pad 130 and the first insulating layer 121. For a method of forming the seed layer 190, another thin film forming method (a sputtering method or a CVD method) may be used or a conducive metal other than Cu may be formed. In order to enhance the adhesion, moreover, the seed layer may be formed after the roughening treatment may be carried out over the surfaces of the first insulating layer 121 and the first electrode pad 130.

Figure 9G:
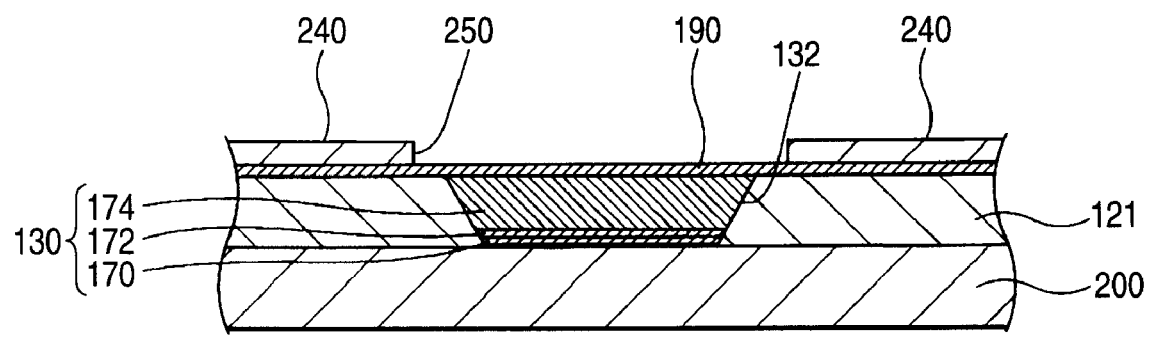
FIG. 9G is a view for explaining a method (No. 7) of manufacturing the wiring board according to the third example.

In FIG. 9G, a dry film resist 240 is laminated as a plating resist on the surface (the upper surface) of the seed layer 190. Then, patterning (exposure and development) is carried out over the dry film resist 240 to form an opening 250 for forming a third electrode pad which exposes a part of the seed layer 190. An inside diameter of the opening 250 for forming a third electrode pad corresponds to an outside diameter of the third electrode pad 136, and a depth of the opening 250 for forming a third electrode pad defines a height (a thickness) of the third electrode pad 136. A liquid resist may be applied in place of the dry film resist 240.

Figure 9H:
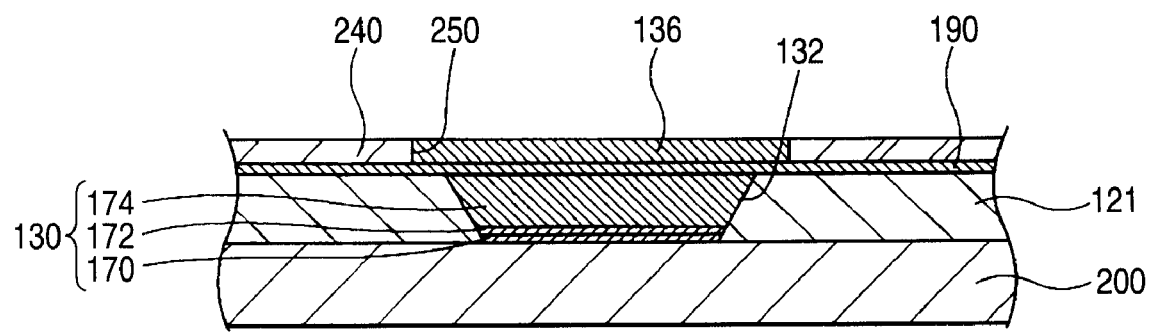
FIG. 9H is a view for explaining a method (No. 8) of manufacturing the wiring board according to the third example.

In FIG. 9H, electrolytic Cu plating is carried out by feeding an electric power from the seed layer 190 so that Cu is deposited in the opening 250 for forming a third electrode pad to form the third electrode pad 136 having a larger diameter than the first electrode pad 130. Consequently, the third electrode pad 136 having a large diameter in a radial direction (a planar direction) is arranged on the surface of the first electrode pad 130.

Figure 9I:
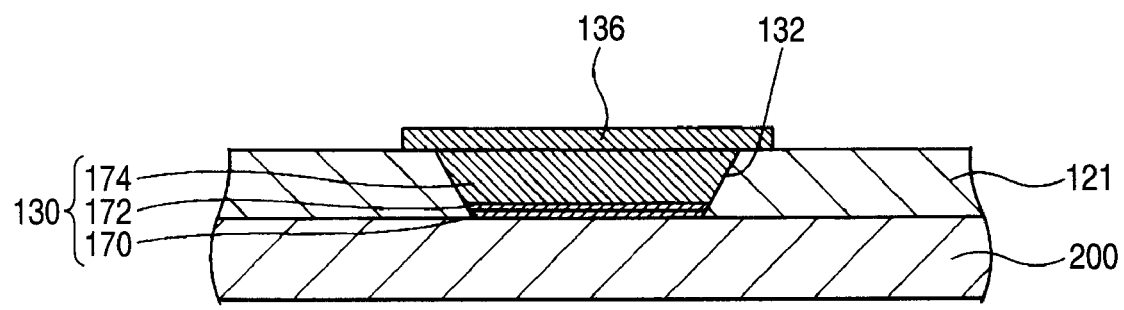
FIG. 9I is a view for explaining a method (No. 9) of manufacturing the wiring board according to the third example.

In FIG. 9I, the dry film resist 240 and the seed layer 190 other than the seed layer 190 provided under the third electrode pad 136 are removed from the first insulating layer 121. Consequently, the third electrode pad 136 is left on the first insulating layer 121. At steps to be carried out in FIG. 9I and the succeeding drawings, Cu in the seed layer 190 provided under the third electrode pad 136 is integrated. Therefore, the seed layer 190 is omitted.

Figure 9J:
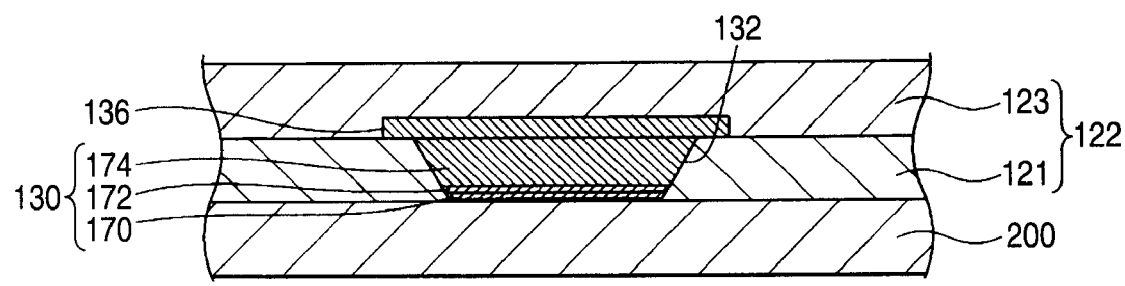
FIG. 9J is a view for explaining a method (No. 10) of manufacturing the wiring board according to the third example.

In FIG. 9J, the roughening treatment is carried out over the surface of the third electrode pad 136 and the resin film such as an epoxy resin or a polyimide resin is then laminated to form the second insulating layer 123. Consequently, there is obtained the first layer 122 having the first electrode pad 130 and the third electrode pad 136.

Figure 9K:
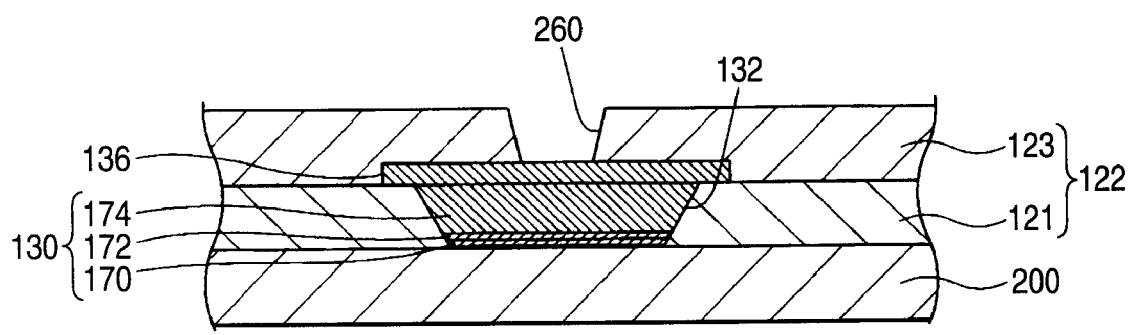
FIG. 9K is a view for explaining a method (No. 11) of manufacturing the wiring board according to the third example.

In FIG. 9K, a laser beam is irradiated on the second insulating layer 123 to form the via hole 260 in such a manner that a center of the surface of the third electrode pad 136 is exposed, for example.

Figure 9L:
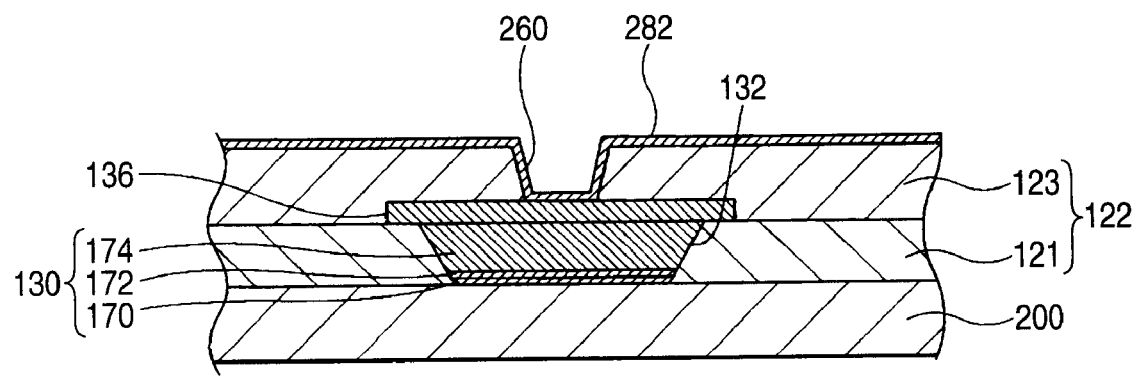
FIG. 9L is a view for explaining a method (No. 12) of manufacturing the wiring board according to the third example.

In FIG. 9L, a seed layer 282 is formed through nonelectrolytic copper plating on the surface of the second insulating layer 123 and the internal surface of the via hole 260.

Figure 9M:
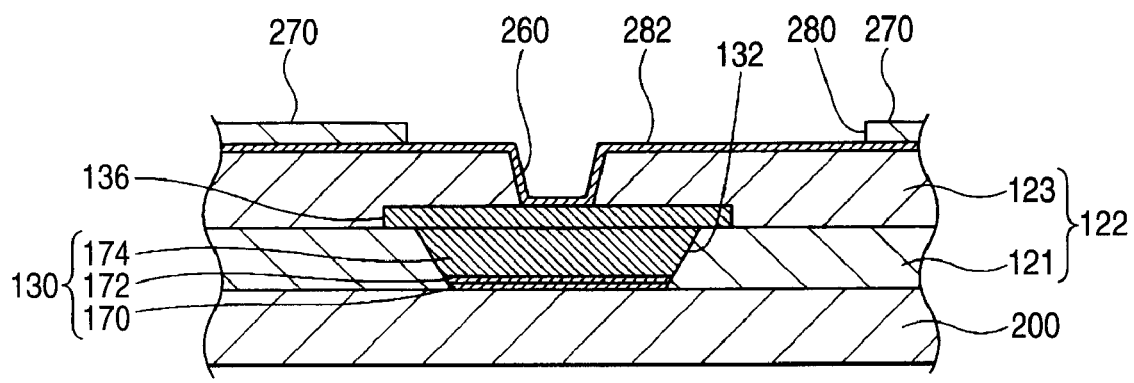
FIG. 9M is a view for explaining a method (No. 13) of manufacturing the wiring board according to the third example.

In FIG. 9M, a dry film resist 270 is laminated as a plating resist on the surface (the upper surface) of the second insulating layer 123. Then, patterning (exposure and development) is carried out over the dry film resist 270 to form an opening 280 for forming a wiring pattern which exposes a part of the seed layer 282. A liquid resist may be applied in place of the dry film resist 270.

Figure 9N:
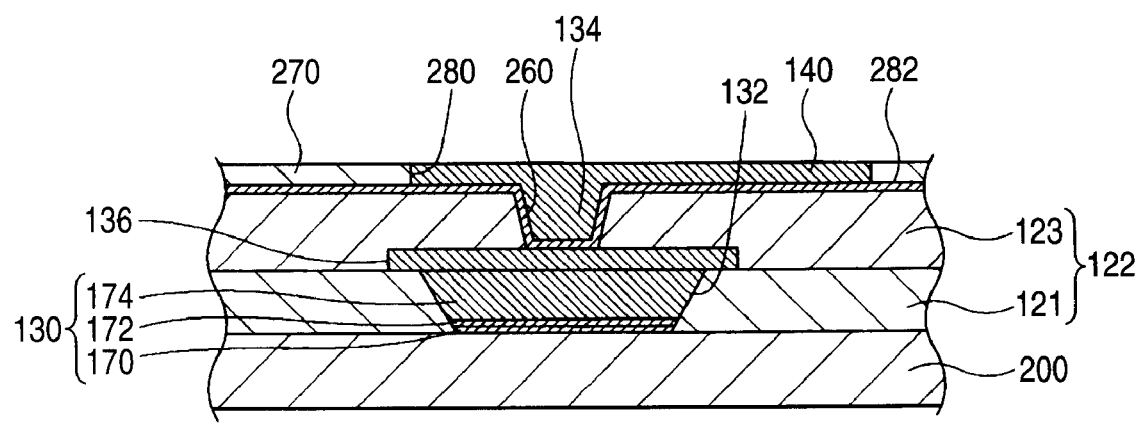
FIG. 9N is a view for explaining a method (No. 14) of manufacturing the wiring board according to the third example.

In FIG. 9N, electrolytic Cu plating is carried out by feeding the seed layer 282 so that Cu is deposited on the via hole 260 and the seed layer 282 in the opening 280 for forming a wiring pattern to form the via 134 and the wiring pattern layer 140.

Figure 9O:
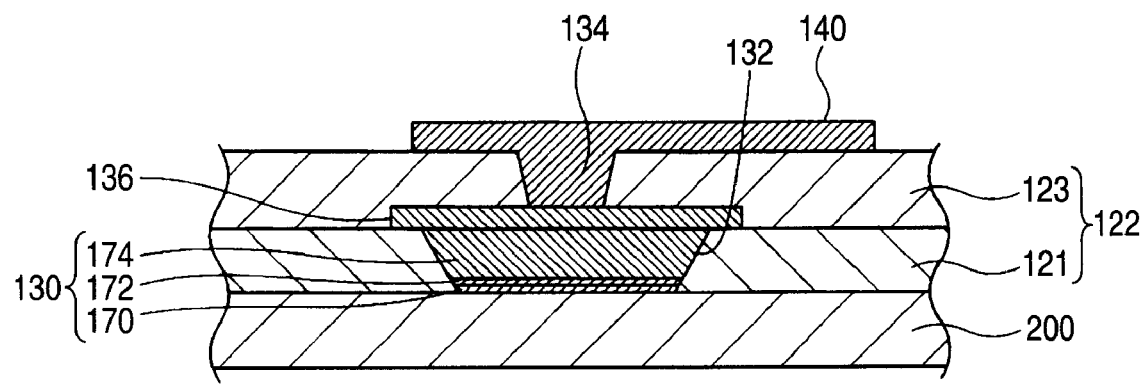
FIG. 9O is a view for explaining a method (No. 15) of manufacturing the wiring board according to the third example.

In FIG. 9O, the dry film resist 270 and the seed layer 282 other than the seed layer 282 provided under the wiring pattern layer 140 are removed from the second insulating layer 123. Consequently, the wiring pattern layer 140 is left on the second insulating layer 123. In FIG. 9O and succeeding drawings, the seed layer 282 is not shown.

Figure 9P:
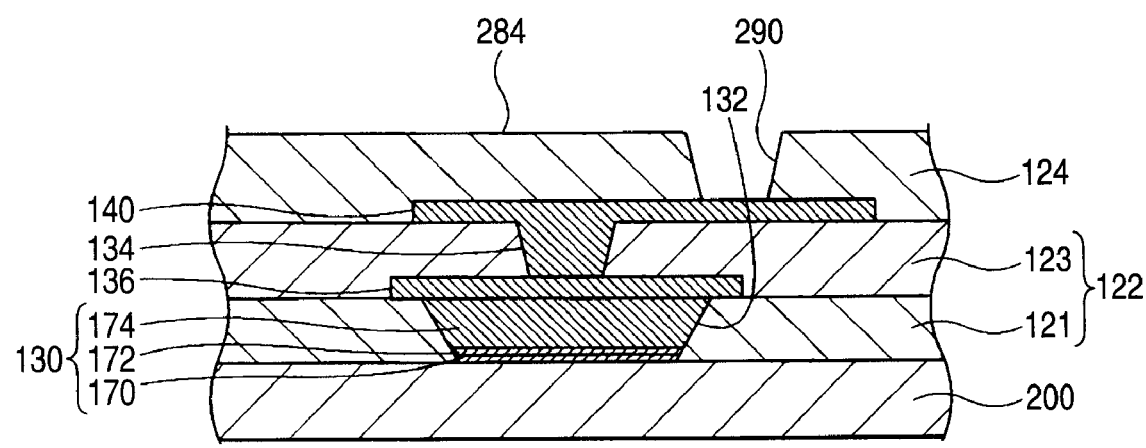
FIG. 9P is a view for explaining a method (No. 16) of manufacturing the wiring board according to the third example.

In FIG. 9P, a roughening treatment is carried out over the surfaces of the second insulating layer 123 and the wiring pattern layer 140 and a film-shaped so-called built-up resin 284 containing an epoxy resin as a main component (a content of a filler may be properly changed corresponding to a hardness or a flexibility which is required) is then laminated to form the insulating layer (the third insulating layer) of the second layer 124. Thereafter, a laser beam is irradiated to form a via hole 290 in such a manner that the surface of the wiring pattern layer 140 is exposed, for example.

Subsequently, the steps of FIGS. 9L to 9P are repeated to form the via 142 of the second layer 124 and the wiring pattern layer 150 of the third layer 126. In the case in which at least four wiring boards 520 are to be arranged, moreover, it is preferable that the steps of FIGS. 9L to 9P should be correspondingly repeated.

Figure 9Q:
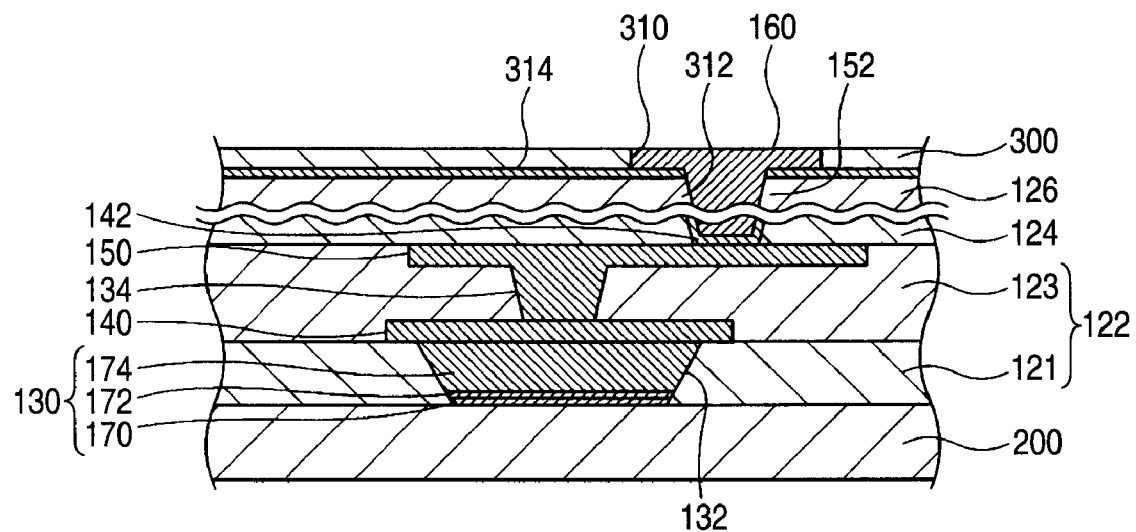
FIG. 9Q is a view for explaining a method (No. 17) of manufacturing the wiring board according to the third example.

In FIG. 9Q, a seed layer 314 is formed by nonelectrolytic Cu plating over the surface (upper surface) of the insulating layer of the third layer 126, and subsequently, a dry film resist 300 is laminated as a plating resist. For a method of forming the seed layer 314, a thin film forming method other than the nonelectrolytic Cu plating may be used or the seed layer 314 may be formed by a conductive metal other than Cu.

Then, patterning (exposure and development) is carried out over the dry film resist 300 to form an opening 310 for forming an electrode which exposes a part of the seed layer 314. Next, electrolytic Cu plating is carried out by feeding the seed layer 314 to deposit Cu in a via hole 312 and the opening 310 for forming an electrode, thereby forming the via 152 and the second electrode pad 160. Then, the dry film resist 300 and the seed layer 314 other than the seed layer 314 provided under the second electrode pad 160 are removed. At steps to be carried out in FIG. 9R and the succeeding drawings, Cu in the seed layer 314 provided under the second electrode pad 160 is integrated. Therefore, the seed layer 314 is omitted.

Figure 9R:
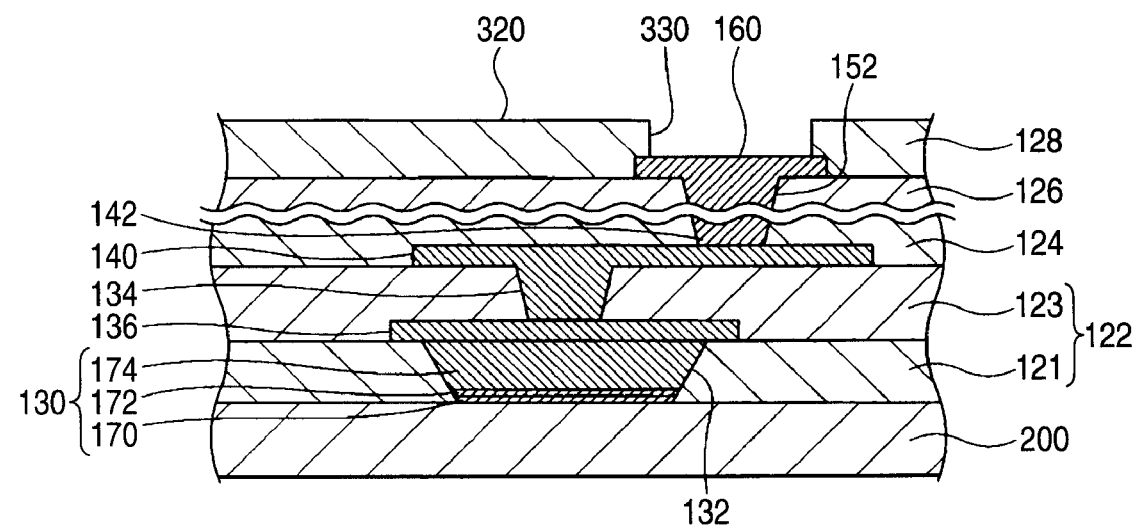
FIG. 9R is a view for explaining a method (No. 18) of manufacturing the wiring board according to the third example.
Figure 9S:
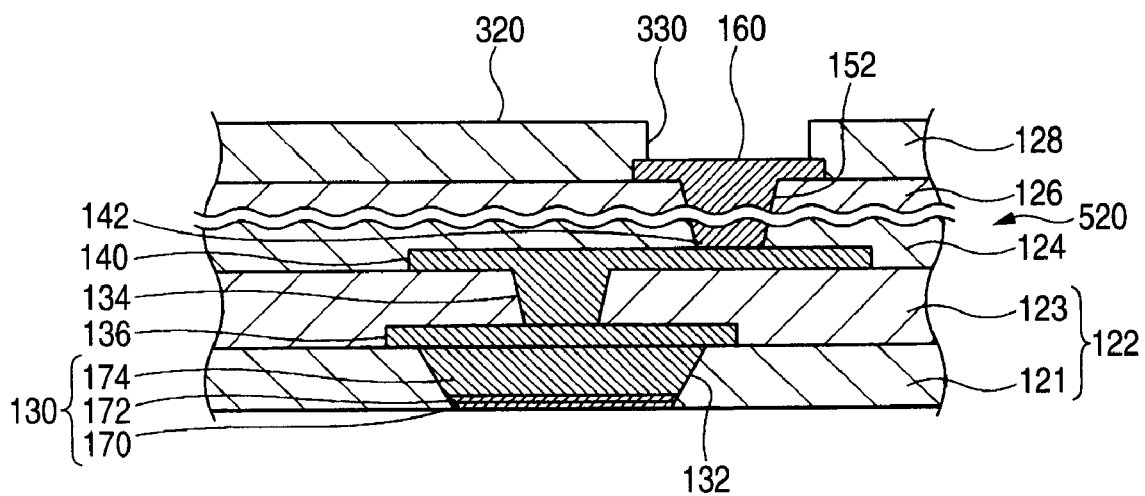
FIG. 9S is a view for explaining a method (No. 19) of manufacturing the wiring board according to the third example.

In FIG. 9R, a solder resist 320 is laminated on the surface (upper surface) of the insulating layer of the third layer 126 and the insulating layer of the fourth layer 128 is thus formed, and an opening 330 is then formed in such a manner that a central part of the second electrode pad 160 is exposed.

In FIG. 9S, the support substrate 200 is removed by wet etching so that the wiring board 520 is obtained. For the support substrate 200, it is also possible to stick two support substrates 200 in a vertical direction and to arrange the wiring board 520 on both surfaces at upper and lower surface sides thereof. In that case, the two support substrates 200 are divided into two parts and are removed by wet etching.

As shown in FIG. 8, then, a solder ball is put on the first electrode pad 130 of the wiring board 520 and are flow is carried out so that each terminal of the semiconductor chip 110 is connected to the first electrode pad 130 through the solder bump 180 and the semiconductor chip 110 is mounted on the wiring board 520. The step of mounting the semiconductor chip 110 on the wiring board 520 is properly selected. For example, there are the case in which the semiconductor chip 110 is mounted on the wiring board 520 according to a request of a customer and the case in which the semiconductor chip 110 is mounted on the wiring board 520 in a customer to which the wiring board 520 is delivered.

In the case in which a thermal stress is generated in the reflow of the solder bump 180, moreover, the adhesion of the taper surface 132 to the first insulating layer 121 is increased because the taper surface 132 having a smaller diameter at the chip mounting side than the substrate laminating side is formed on the outer periphery of the first electrode pad 130. Consequently, a crack can be prevented from being generated. Furthermore, the tapered opening internal wall of the first insulating layer 121 is formed to cover the whole periphery of the taper surface 132. Therefore, a holding force for the first electrode pad 130 is increased. Even if a force for pulling out the semiconductor chip 110 is applied after the chip is mounted, consequently, the first electrode pad 130 can be prevented from being separated from the insulating layer of the first layer 122.

In the example, furthermore, the third electrode pad 136 is formed to be protruded in the radial direction (the planar direction) from the outside diameter of the first electrode pad 130. Therefore, a direction of advance of the thermal stress is blocked by the third electrode pad 136 and is absorbed in a direction along the boundary surface between the first insulating layer 121 and the second insulating layer 123. In the wiring board 520 according to the third example, therefore, it is possible to prevent a crack from being generated on the second insulating layer 123 covering the outer periphery of the third electrode pad 136.

Figure 10:
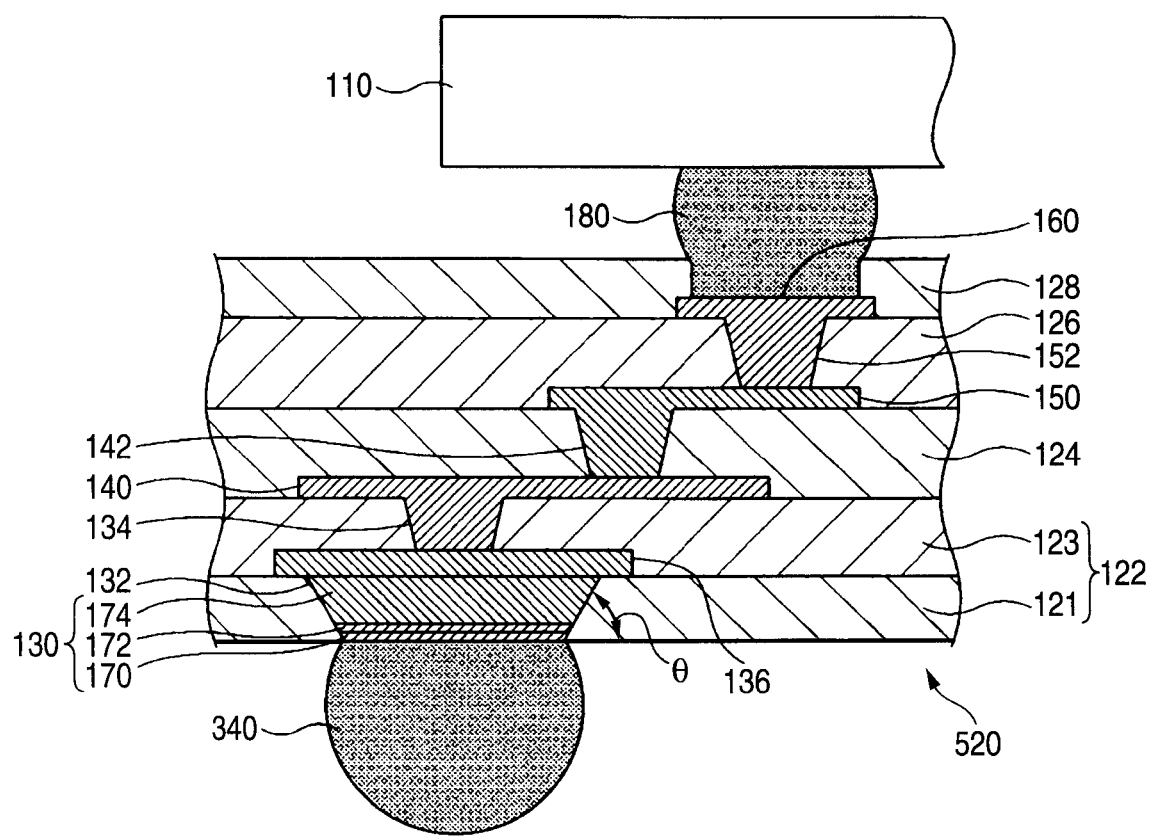
FIG. 10 is a view showing a variant of the third example.

FIG. 10 is a view showing a variant of the third example. As shown in FIG. 10, in the variant, the wiring board 520 is used in a reversely vertical direction to that in the case of the third example. More specifically, the semiconductor chip 110 is mounted on the second electrode pad 160 through the solder bump 180 and a solder bump 340 is formed on the first electrode pad 130 through a reflow of a solder ball. A pin may be soldered in place of the solder bump 340.

In the variant, the solder bump 340 is connected to the first electrode pad 130. Therefore, a bonding strength obtained by increasing the adhesion of the taper surface 132 to the insulating layer of the first layer 122 acts on the solder bump 340.

The semiconductor chip 110 may be mounted on either the first electrode pad 130 or the second electrode pad 160 in the wiring board 520 as shown in FIGS. 8 and 10.

In the variant, a plated layer having Au and Ni layers arranged (in such a manner that the Au layer is exposed to a surface) may be provided on the second electrode pad 160. Moreover, it is also possible to use Au/Pd/Ni, Sn/Ni, Sn—Ag (an alloy of tin and silver) and Sn in place of the Au layer 170 and the Ni layer 172. Furthermore, the first electrode pad 130 may be formed by only the metals. In addition, it is a matter of course that each metal is not restricted to the metals but is usable and a combination of the respective metals is not restricted to the combination.

In the variant, furthermore, it is also possible to finish the semiconductor device by loading the semiconductor chip 110 onto the wiring board 520 and then removing the support substrate 200 at the step of FIG. 9R.

Also in the variant, an underfill resin having an insulating property may be filled between the semiconductor chip 110 and the wiring board 520.

Moreover, the semiconductor chip 110 may be mounted on the wiring board 520 through wire bonding in place of t he solder bump 180. Furthermore, the semiconductor chip 110 may be mounted on the wiring board 520 by soldering a pin in place of the solder bump 180.

FOURTH EXAMPLE

Figure 11:
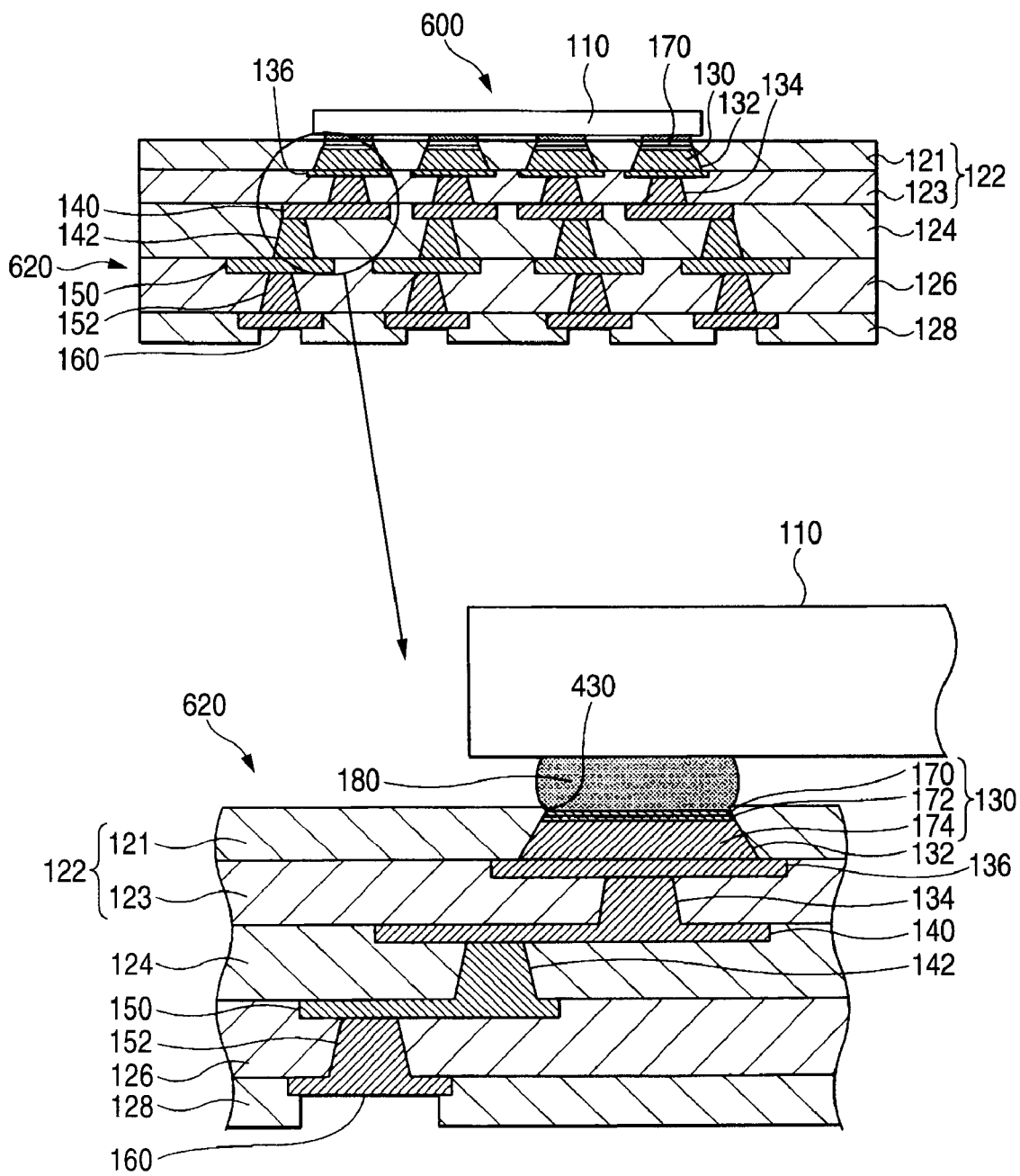
FIG. 11 is a longitudinal sectional view showing a semiconductor device to which a fourth example of the wiring board is applied.

FIG. 11 is a longitudinal sectional view showing a semiconductor device to which a fourth example of the wiring board is applied. In FIG. 11, the same portions as those in the first to third examples have the same reference numerals and description thereof will be omitted.

As shown in FIG. 11, in a wiring board 620 to be used in a semiconductor device 600 according to the fourth example, there is formed an electrode opening 430 in which a surface of a first electrode pad 130 (an end face on an Au layer 170 side) is tapered and concaved from a surface of a first insulating layer 121. Therefore, a solder bump 180 is formed on the Au layer 170 side by carrying out a reflow (a heat treatment) with a solder ball inserted in the electrode opening 430.

Although a method of manufacturing the wiring board 620 to be used in the semiconductor device 600 is the same as the steps shown in FIGS. 9A to 9S according to the third example, it is different in that the Cu layer is arranged on the support substrate 200 at the step of FIG. 9D and is removed together with the support substrate 200 at the step of FIG. 9S.

In the fourth example, accordingly, an electric power is fed to the support substrate 200 for an inner part of a tapered opening 220 for forming a first electrode pad to carry out electrolytic Cu plating so that Cu is deposited on the support substrate 200 in the tapered opening 220 for forming a first electrode pad to form a Cu layer 440 (see FIG. 6B) at the step of FIG. 9D. Subsequently, the electric power is fed to the support substrate 200 to carry out electrolytic plating so that Au is deposited on the Cu layer 440 in the tapered opening 220 for forming a first electrode pad to provide the Au layer 170, and furthermore, Ni is deposited on a surface of the Au layer 170 to arrange an Ni layer 172. Furthermore, the support substrate 200 is used as the feeding layer to carry out the electrolytic plating so that Cu is deposited on the Ni layer 172 in the tapered opening 220 for forming a first electrode pad to arrange a Cu layer 174.

At the step of FIG. 9S, moreover, the support substrate 200 is removed by wet etching and the Cu layer 440 is also removed so that the wiring board 620 is obtained. In the wiring board 620, the Cu layer 440 is removed so that the electrode opening 430 (see FIG. 6O) concaved from the surface of the first insulating layer 121 is formed on a lower surface side (a chip mounting side).

Also in the fourth example, for the support substrate 200, it is also possible to stick two support substrates 200 in a vertical direction and to arrange the wiring board 620 on both surfaces at upper and lower surface sides thereof. In that case, the two support substrates 200 are divided into two parts and are removed by wet etching.

As shown in FIG. 11, then, a solder ball is put on the Au layer 170 which is concaved into the electrode opening 430 and a reflow is carried out so that each terminal of the semiconductor chip 110 is connected to the first electrode pad 130 through the solder bump 180 and the semiconductor chip 110 is mounted on the wiring board 620. The step of mounting the semiconductor chip 110 on the wiring board 620 is properly selected. For example, there are the case in which the semiconductor chip 110 is mounted on the wiring board 620 according to a request of a customer and the case in which the semiconductor chip 110 is mounted on the wiring board 620 in a customer to which the wiring board 620 is delivered.

In the wiring board 620 according to the fourth example, thus, the electrode opening 430 which is concaved from the surface of the first insulating layer 121 is formed on the lower surface side (the chip mounting side). When the semiconductor chip 110 is to be mounted, therefore, the solder bump 180 is bonded to the Au layer 170 side of the first electrode pad 130 by carrying out a reflow (a heat treatment) over the electrode opening 430. Consequently, the solder bump 180 is reliably bonded to the first electrode pad 130 and a bonding strength in a radial direction is also increased by a peripheral edge portion of the electrode opening 430.

In the semiconductor device 600 according to the fourth example, an underfill resin having an insulating property may be filled between the semiconductor chip 110 and the wiring board 620. Moreover, it is also possible to use Au/Pd/Ni, Sn/Ni, Sn—Ag (an alloy of tin and silver) and Sn in place of the Au layer 170 and the Ni layer 172. Furthermore, the first electrode pad 130 may be formed by only the metals. In addition, it is a matter of course that each metal is not restricted to the metals but is usable and a combination of the respective metals is not restricted to the combination.

In the variant, furthermore, in the case in which a thermal stress is generated in the reflow of the bump 180, the adhesion of the taper surface 132 to the first insulating layer 121 is increased because the taper surface 132 having a small diameter at the chip mounting side than the substrate laminating side is formed on the outer periphery of the first electrode pad 130. Consequently, it is possible to prevent a crack from being generated.

Moreover, the third electrode pad 136 formed widely is formed to be protruded in the radial direction (the planar direction) from the outside diameter of the first electrode pad 130. Therefore, a direction of advance of the thermal stress is blocked by the third electrode pad 136 and is absorbed in a direction along the boundary surface between the first insulating layer 121 and the second insulating layer 123. In the wiring board 620 according to the fourth example, therefore, it is possible to prevent a crack from being generated in the second insulating layer 123 covering the outer periphery of the third electrode pad 136 in the same manner as in the third example.

Figure 12:
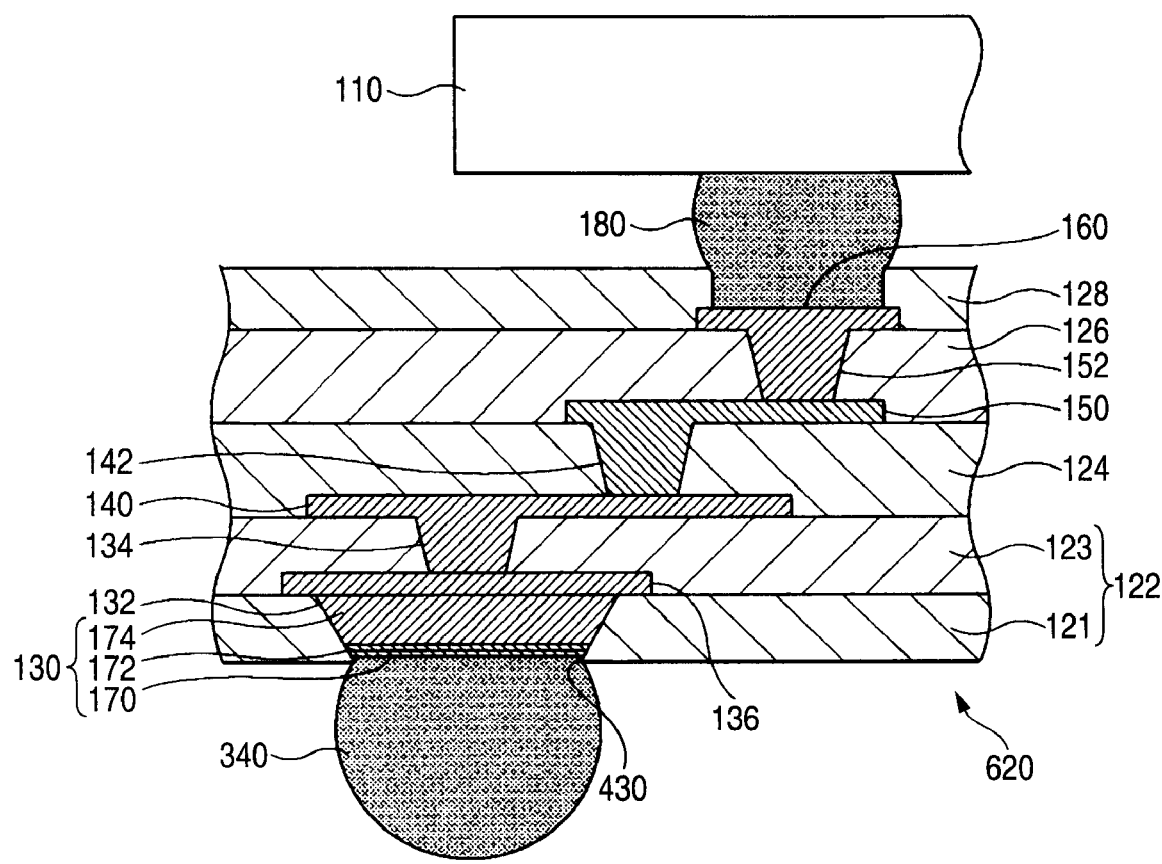
FIG. 12 is a view showing a variant of the fourth example.

FIG. 12 is a view showing a variant of the fourth example. As shown in FIG. 12, in the variant, the wiring board 620 is used in a reversely vertical direction to that in the case of the fourth example. More specifically, the semiconductor chip 110 is mounted on the second electrode pad 160 through the solder bump 180 and a solder bump 340 is formed on the first electrode pad 130 through a reflow of a solder ball. In this case, the solder bump 340 is formed in an electrode opening (a concave portion) 430 which is concaved from a surface of a first insulating layer 121. Therefore, a bonding strength in a radial direction can be increased by a peripheral edge portion of the electrode opening 430. A pin may be soldered in place of the solder bump 340.

In the variant, the solder bump 340 is connected to the first electrode pad 130. Therefore, a bonding strength obtained by an increase in the adhesion of the taper surface 132 to the insulating layer of the first layer 122 acts on the solder bump 340.

The semiconductor chip 110 may be mounted on either the first electrode pad 130 or the second electrode pad 160 in the wiring board 620 as shown in FIGS. 11 and 12.

In the variant, a plated layer having Au and Ni layers arranged (in such a manner that the Au layer is exposed to a surface) may be provided on the second electrode pad 160. Moreover, it is also possible to use Au/Pd/Ni, Sn/Ni, Sn—Ag (an alloy of tin and silver) and Sn in place of the Au layer 170 and the Ni layer 172. Furthermore, the first electrode pad 130 may be formed by only the metals. In addition, it is a matter of course that each metal is not restricted to the metals but is usable and a combination of the respective metals is not restricted to the combination.

In the variant, furthermore, it is also possible to finish the semiconductor device by loading the semiconductor chip 110 onto the wiring board 620 and then removing the support substrate 200.

Also in the variant, an underfill resin having an insulating property may be filled between the semiconductor chip 110 and the wiring board 620.

Moreover, the semiconductor chip 110 may be mounted on the wiring board 620 through wire bonding in place of the solder bump 180. Furthermore, the semiconductor chip 110 may be mounted on the wiring board 620 by soldering a pin in place of the solder bump 180.

It is a matter of course that the electrode pad according to the invention can be applied to an electrode pad for external connection such as BGA (Ball Grid Array), PGA (Pin Grid Array) or LGA (Land Grid Array) in addition to an electrode pad for semiconductor chip loading.

Moreover, the invention can be applied to a semiconductor device having a structure in which an electronic component is loaded onto a substrate or a structure in which a wiring pattern is formed on a substrate in addition to the semiconductor device having the structure in which the solder bump 180 is formed. Therefore, it is a matter of course that the invention can also be applied to a flip chip to be bonded onto a substrate through a solder bump or a multilayer substrate or an interposer to which a circuit board is bonded through a solder bump, for example.

What is claimed is:

1. A method of manufacturing a wiring board comprising:
a first step of forming a first insulating layer on a support substrate, said first insulating layer having a substrate facing surface and an outward facing surface opposite to the substrate facing surface, said substrate facing surface provided directly on a support substrate first surface;
a second step of forming, in the first insulating layer, a tapered opening having a small diameter at the substrate facing surface and a large diameter at the outward facing surface, said tapered opening exposing a portion of the support substrate first surface;
a third step of forming, on an inner part of the tapered opening and the portion of the support substrate first surface which is exposed by the tapered opening, a first electrode pad having a small diameter at a substrate facing end provided on the portion of the support substrate first surface which is exposed by the tapered opening, and a large diameter at an outward facing end opposite to the substrate facing end and adjacent to the outward facing surface of the first insulating layer, wherein the first electrode pad is formed such that the outward facing end of the first electrode pad defines a surface which is flush with the outward facing surface of the first insulating layer;
a fourth step of forming, on the outward facing end of the first electrode pad and the outward facing surface of the first insulating layer, a second electrode pad to be electrically connected to the first electrode pad such that a diameter of the second electrode pad is larger than the large diameter of the first electrode pad when viewed from a top;
a fifth step of forming a second insulating layer on the outward facing surface of the first insulating layer and the second electrode pad to cover the second electrode pad; and
a sixth step of removing the support substrate and exposing the substrate facing end of the first electrode pad.

2. The method of manufacturing a wiring board according to claim 1, wherein
the third step includes a step of roughening an inner part of the tapered opening before forming the first electrode pad.

3. The method of manufacturing a wiring board according to claim 1, wherein
the support substrate is formed of a metal;
the third step includes a step of forming a metal layer on the portion of the support substrate first surface which is exposed by the tapered opening between the support substrate and the first electrode pad such that the metal layer covers the substrate facing end of the first electrode pad, said metal layer formed from a same type of metal as the support substrate; and
the sixth step includes a step of removing the support substrate and removing the metal layer to expose the substrate facing end of the first electrode pad, the substrate facing end of the first electrode pad being recessed relative to the substrate facing surface of the first insulating layer.

4. The method of manufacturing a wiring board according to claim 1, wherein
the first electrode pad has a tilt angle θ to a horizontal plane of a tapered outer peripheral surface which is set to be 50 to 80 degrees.

5. A method of manufacturing a semiconductor device using the method of manufacturing a wiring board according to claim 1, further comprising:
a step of mounting a semiconductor chip on the first electrode pad through a solder bump, said solder bump formed to directly contact the substrate facing end of the first electrode pad.

6. A method of manufacturing a semiconductor device using the method of manufacturing a wiring board according to claim 1, further comprising:
a step of mounting a semiconductor chip on a surface at an opposite side to an electrode pad forming surface on which the first electrode pad of the wiring board is formed.

7. The method of manufacturing a wiring board according to claim 1, comprising a further step of forming a via through the second insulating layer to expose a surface of the second electrode pad.

8. The method of manufacturing a wiring board according to claim 1, wherein the second step of forming the tapered opening in the first insulating layer includes removing a portion of the first insulating layer formed on the support substrate without removing any portion of the support substrate.

9. The method of manufacturing a wiring board according to claim 1, wherein the fourth step includes forming the second electrode pad entirely outside of the tapered opening formed in the first insulating layer.

10. The method of manufacturing a wiring board according to claim 9, wherein the third step includes forming the first electrode pad entirely within the tapered opening formed in the first insulating layer.

11. The method of manufacturing a wiring board according to claim 1, wherein the third step includes forming the first electrode pad entirely within the tapered opening formed in the first insulating layer.

12. The method of manufacturing a wiring board according to claim 1, wherein the third step includes forming the first electrode pad such that the substrate facing end is flush with the substrate facing surface of the first insulating layer.

13. The method of manufacturing a wiring board according to claim 1, wherein the third step includes forming the first electrode pad such that side surfaces extending between the first electrode pad substrate facing end and the first electrode pad outward facing end are flush with tapered side walls defining the tapered opening formed in the first insulating layer.

14. The method of manufacturing a wiring board according to claim 1, wherein the third step further comprises polishing the first insulating layer such that the surface of the outward facing end of the first electrode pad is flush with the outward facing surface of the first insulating layer.

15. The method of manufacturing a wiring board according to claim 2, wherein a surface roughness of the roughened inner part of the tapered opening is in a range of 0.25 μm to 0.75 μm.

* * * * *